US009592739B2

(12) United States Patent
Fujito et al.

(10) Patent No.: US 9,592,739 B2
(45) Date of Patent: Mar. 14, 2017

(54) DRIVE CONTROL EQUIPMENT FOR A VEHICLE

(71) Applicant: KABUSHIKI KAISHA TOSHIBA, Minato-ku, Tokyo (JP)

(72) Inventors: Haruhiko Fujito, Tokyo (JP); Michiaki Ishikawa, Hannou Saitama (JP); Hiroaki Yoshinari, Tokyo (JP); Hideyuki Shimizu, Tokyo (JP); Takashi Takagi, Kawasaki Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 292 days.

(21) Appl. No.: 14/456,855

(22) Filed: Aug. 11, 2014

(65) Prior Publication Data

US 2014/0345492 A1    Nov. 27, 2014

Related U.S. Application Data

(63) Continuation of application No. PCT/JP2013/000493, filed on Jan. 30, 2013.

(30) Foreign Application Priority Data

Feb. 13, 2012    (JP) ................. 2012-028941

(51) Int. Cl.
*B60L 9/00*    (2006.01)
*B60L 9/32*    (2006.01)
(Continued)

(52) U.S. Cl.
CPC ............. *B60L 9/32* (2013.01); *B60L 3/003* (2013.01); *B60L 11/1803* (2013.01);
(Continued)

(58) Field of Classification Search
CPC ........ B60L 9/32; B60L 3/003; B60L 11/1803; B60L 15/007; B61C 3/00; H02M 7/003; H02P 27/06; H05K 7/1432; H05K 7/209
See application file for complete search history.

(56) References Cited

U.S. PATENT DOCUMENTS

| 8,228,008 B2 | 7/2012 | Kitanaka |
| 2005/0235865 A1* | 10/2005 | Kumar ................ B60L 9/16 |
| | | 105/61 |

(Continued)

FOREIGN PATENT DOCUMENTS

| DE | 19734270 A1 | 2/1999 |
| JP | 2002159104 A | 5/2002 |

(Continued)

OTHER PUBLICATIONS

Extended European Search Report dated Sep. 24, 2015, issued in counterpart European Application No. 13748560.3.

(Continued)

*Primary Examiner* — Jason C Smith
(74) *Attorney, Agent, or Firm* — Holtz, Holtz & Volek PC

(57) ABSTRACT

Drive control equipment for a vehicle comprises: a plurality of power conversion devices respectively connected with a plurality of motors that convert DC power supplied from a DC power source to AC power and output this to said motors; a control device that controls the power conversion devices; a frame that accommodates said power conversion devices and the control device and having a ceiling wall facing below the vehicle floor; and a power unit having a cooler in which are installed a plurality of semiconductor elements constituting the power conversion devices; a first control board provided with a first connector connected with said semiconductor elements, arranged facing the cooler; and a second control board arranged in a direction orthogo- (Continued)

nal to said first control board and connected with a second connector connected with the first connector of said first control board.

14 Claims, 24 Drawing Sheets

(51) Int. Cl.
| | |
|---|---|
| H02P 27/06 | (2006.01) |
| H02M 7/00 | (2006.01) |
| B60L 3/00 | (2006.01) |
| B60L 11/18 | (2006.01) |
| B61C 3/00 | (2006.01) |
| B60L 15/00 | (2006.01) |
| H05K 7/14 | (2006.01) |
| H05K 7/20 | (2006.01) |

(52) U.S. Cl.
CPC ............. *B60L 15/007* (2013.01); *B61C 3/00* (2013.01); *H02M 7/003* (2013.01); *H02P 27/06* (2013.01); *H05K 7/1432* (2013.01); *H05K 7/209* (2013.01); *B60L 2200/26* (2013.01); *B60L 2220/14* (2013.01); *B60L 2220/44* (2013.01); *B60L 2240/36* (2013.01); *B60L 2260/28* (2013.01); *Y02T 10/644* (2013.01); *Y02T 10/645* (2013.01); *Y02T 10/648* (2013.01); *Y02T 10/7005* (2013.01)

(56) References Cited

U.S. PATENT DOCUMENTS

| | | | |
|---|---|---|---|
| 2005/0284673 A1* | 12/2005 | Nakazawa | ............ H02M 7/483 |
| | | | 180/65.1 |
| 2007/0183130 A1 | 8/2007 | Yamabuchi et al. | |
| 2008/0179999 A1* | 7/2008 | Nakazawa | ............... B60L 9/005 |
| | | | 310/68 D |
| 2010/0036555 A1 | 2/2010 | Hosoda et al. | |
| 2010/0171448 A1* | 7/2010 | Kitanaka | ................... B60L 9/32 |
| | | | 318/45 |
| 2011/0013439 A1 | 1/2011 | Yamabuchi et al. | |
| 2012/0090499 A1* | 4/2012 | Shimada | .................... B61C 3/02 |
| | | | 105/49 |
| 2014/0145678 A1* | 5/2014 | Hwang | ................. H02J 7/0016 |
| | | | 320/118 |
| 2014/0156135 A1* | 6/2014 | Maki | ...................... G07C 5/008 |
| | | | 701/29.1 |
| 2014/0345492 A1* | 11/2014 | Fujito | ..................... H02P 27/06 |
| | | | 105/61 |
| 2015/0061377 A1* | 3/2015 | Ishikawa | ................... B61C 3/02 |
| | | | 307/9.1 |
| 2015/0062811 A1* | 3/2015 | Suzuki | ...................... B61C 3/00 |
| | | | 361/690 |
| 2016/0016475 A1* | 1/2016 | Toda | ..................... H02M 7/003 |
| | | | 318/400.26 |

FOREIGN PATENT DOCUMENTS

| | | |
|---|---|---|
| JP | 2007209184 A | 8/2007 |
| JP | 2009165327 A | 7/2009 |
| JP | 2010284033 A | 12/2010 |
| JP | 2011166969 A | 8/2011 |
| JP | 2011229372 A | 11/2011 |
| WO | 2008149447 A1 | 12/2008 |

OTHER PUBLICATIONS

International Search Report dated May 21, 2013 issued in International Application No. PCT/JP2013/000493.
Japanese Office Action dated Feb. 24, 2015, issued in counterpart Japanese Application No. 2012-028941.
Chinese Office Action dated Apr. 5, 2016, issued in counterpart Chinese Application No. 201380011631.7.

\* cited by examiner

DRIVE CONTROL EQUIPMENT FOR A VEHICLE

CROSS REFERENCE TO RELATED APPLICATION

This is a Continuation of PCT Application No. PCT/JP2013/000493, filed on Jan. 30, 2013, which is based upon and claims the benefit of priority from the prior Japanese Patent Application No. 2012-28941, filed on Feb. 13, 2012, the entire contents of which are incorporated herein by reference.

FIELD

An embodiment of the present invention relates to drive control equipment for a rail vehicle.

BACKGROUND

A rail vehicle is equipped with for example a plurality of motors that drive the vehicle (that is to say, wheels) and air conditioning equipment and the like, and drive control equipment that controls the motors. The drive control equipment comprises a power conversion device such as a converter that converts AC voltage supplied from the power source to DC voltage and outputs the DC voltage to a motor, or an inverter that converts DC voltage to three-phase AC voltage and outputs the three-phase AC voltage to a motor, and a control device that controls the power conversion device and the motors. In addition, the drive control equipment comprises for example a contactor or breaker connected between the power conversion device and the motor. The contactor opens and closes the connection of the power conversion device and the motor: it opens the connection for example on stoppage of operation by the drive control equipment or in the event of abnormality. An example of such a thing is disclosed in Japanese Patent Number 4297971 (hereinafter referred to as Patent Reference 1).

In recent years, permanent magnet synchronous motors are being employed as motors for rail vehicles. Permanent magnet synchronous motors have the advantage of high efficiency, compared with induction motors. However, permanent magnet synchronous motors require a driving inverter for each motor. In the case of a rail vehicle, an arrangement is adopted in which each vehicle is driven by a group of a plurality of motors, so, in the drive control equipment used to drive the plurality of motors, the number of inverters required must be increased, together with increase in the number of elements and increase in the number of contactors. This results in large external dimensions and mass of the drive control equipment, increasing manufacturing costs.

The present invention was made in view of the foregoing, the problem of the invention being to provide drive control equipment for a rail vehicle in which increase in size of the equipment can be restricted and manufacturing costs can be reduced.

In this embodiment, vehicle drive control equipment for driving a plurality of motors provided in a vehicle has the following construction. Specifically, it comprises:

a plurality of power conversion devices respectively connected to a plurality of motors provided in a vehicle, that convert a DC power that is supplied from a DC power source to AC power and output the AC power to the motors;

a control device that controls said power conversion devices;

a frame, having a ceiling wall facing a floor of the vehicle, a bottom wall facing a ground, and a sidewall connecting the ceiling wall and the bottom wall, that accommodates the power conversion devices and the control device; and a power unit having a cooler in which are mounted a plurality of semiconductor elements constituting the power conversion devices, a first control board having a first connector connected with the semiconductor elements, arranged facing the cooler, and a second control board having a second connector connected with the first connector of the first control board, arranged a direction orthogonal to the first control board.

DETAILED DESCRIPTION

Drive control equipment according to embodiments will be described below with reference to the drawings.

First Embodiment

Figure 1:
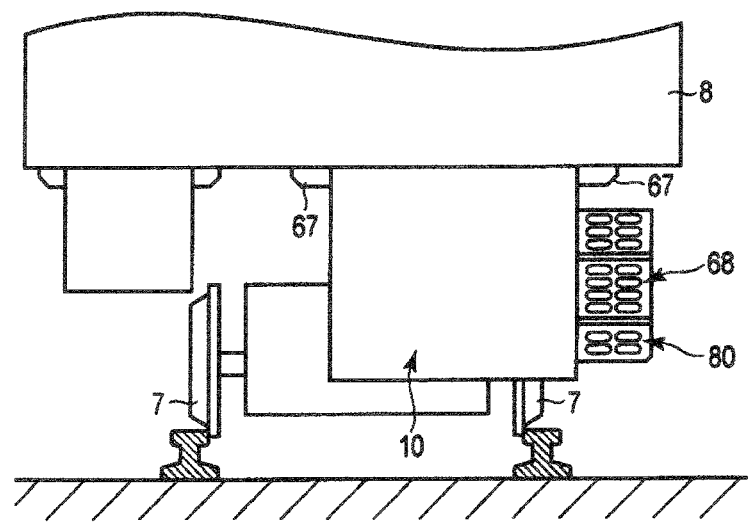
FIG. 1 is a side view showing a condition in which drive control equipment according to a first embodiment is stowed below the floor of a vehicle.
Figure 2:
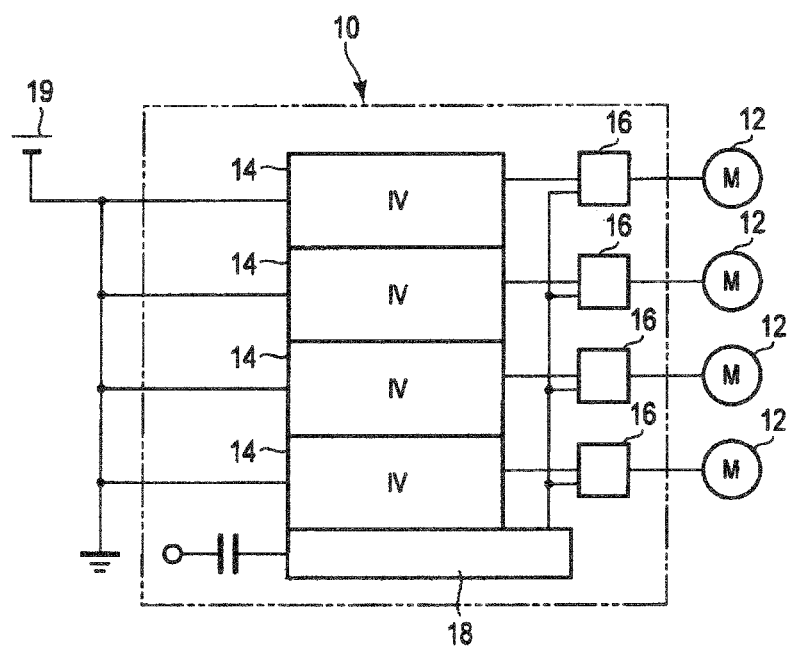
FIG. 2 is a block diagram showing said drive control equipment schematically.

FIG. 1 is a block diagram showing drive control equipment 10 installed on a floor frame of a rail vehicle 8 according to a first embodiment. FIG. 2 is a block diagram showing the entire construction of the drive control equipment schematically.

As shown in FIG. 1 and FIG. 2, drive control equipment 10 is placed between a rail vehicle 8 and the rails 7a, below the floor frame of the vehicle, and constitutes drive control equipment that drives a plurality of motors, for example four motors 12a to 12d (when there are a plurality of devices of the same type, if necessary, these will be indicated by the suffixes a, b, c, d, . . . ), that drive the wheels 7 of the rail vehicle. As the motors 12, for example permanent magnet synchronous motors are employed. The drive control equipment 10 comprises four power conversion devices, for example inverters (IV) 14a to 14d that are respectively connected with a single motor 12, four contactors 16 that are connected between the inverters and the motors 12, and a control device 18 that controls the inverters 14, the contactors 16 and the motors 12.

Figure 3:
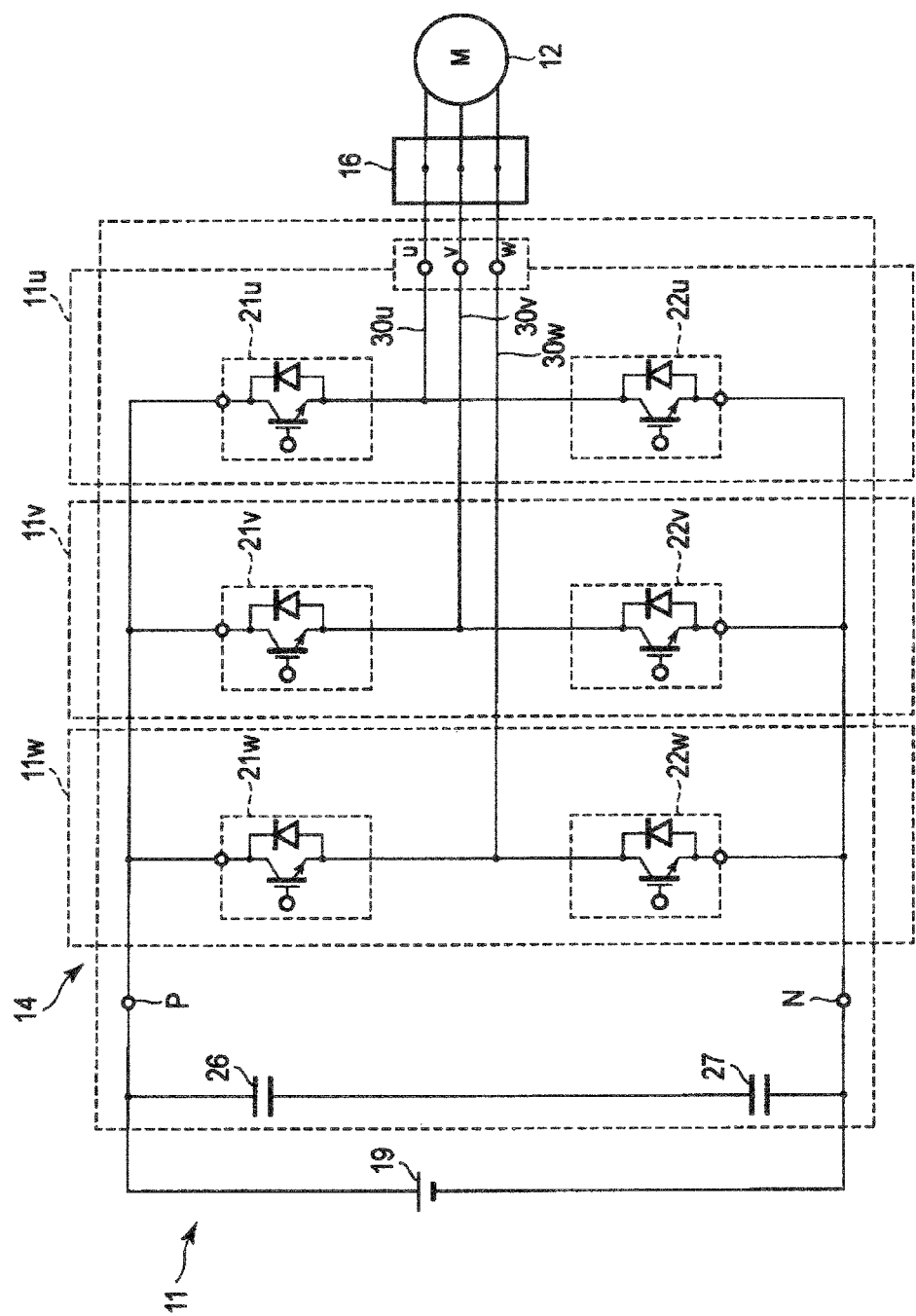
FIG. 3 is a view showing the inverter circuit of an inverter of said drive control equipment.

The inverters 14 convert the DC power that is supplied from the DC power source 19 to AC power, which is then output to the motors 12. As shown in FIG. 3, each inverter 14 is constituted as a two-level power conversion device and includes: a three-phase inverter circuit 11, a cooler, to be later described, that cools the semiconductor elements that constitute the inverter circuit, and a detector.

(Electrical Circuit)

The inverter circuit 11 has U-phase, V-phase and W-phase units. The U-phase unit 11u has first and second switching elements 21u, 22u, that are connected in series between the DC positive electrode terminal P and the DC negative electrode terminal N of the DC power source 19. Likewise, the V-phase unit 11v has first and second switching elements 21v, 22v, that are connected in series between the DC positive electrode terminal P and the DC negative electrode terminal N; and the W-phase unit 11w has first and second switching elements 21w, 22w, that are connected in series between the DC positive electrode terminal P and the DC negative electrode terminal N. The plurality of semiconductor switching elements comprises for example an IGBT (insulated gate bipolar transistor) or GTO or the like self-turn-off semiconductor element: for example, an IGBT and diode connected in anti-parallel with this IGBT may be embodied in modular form. The diode or IGBT in each switching element may be formed for example by an Si or silicon nitride (SiC) element, which is a low-loss semiconductor element.

The U-phase unit 11U, V-phase unit 11V and W-phase unit 11W are connected in parallel; in addition, series-connected filter capacitors 26, 27 are connected in parallel with each unit. The filter capacitors 26, 27 are for example power source smoothing capacitors and may be aluminum dry capacitors or the like. An output terminal 30u is connected between the first switching elements 21u and the second switching element 22u of the U-phase unit 11U; an output terminal 30v is connected between the first switching element 21v and the second switching element 22v of the V-phase unit 11V; an output terminal 30w is connected between the first switching element 21w and the second switching element 22w of the W-phase unit 11W.

The output terminals 30u, 30v, 30w of three-phase U, V, and W are connected with the motor 12 through a single contactor 16 and deliver three-phase AC output power to the motor 12. The first to fourth switching elements 21u, 22u, 21v, 22v, 21w, 22w of each phase referred to above are mounted on a heat-sink face of a heat-sink block constituting the cooler.

(Overall Construction of the Equipment)

Next, a detailed description will be given of the overall construction of the drive control equipment 10.

Figure 4:
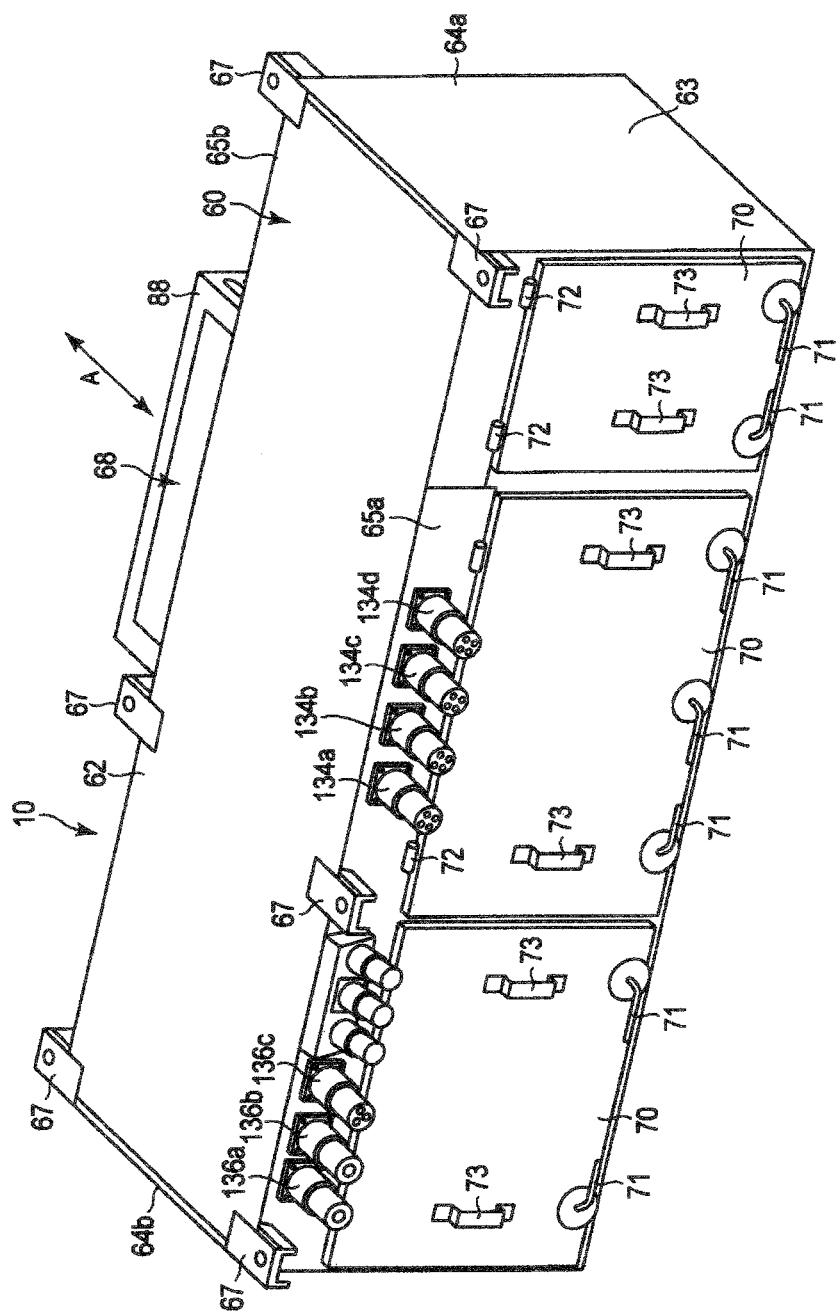
FIG. 4 is a perspective view showing the external appearance of said drive control equipment.
Figure 5:
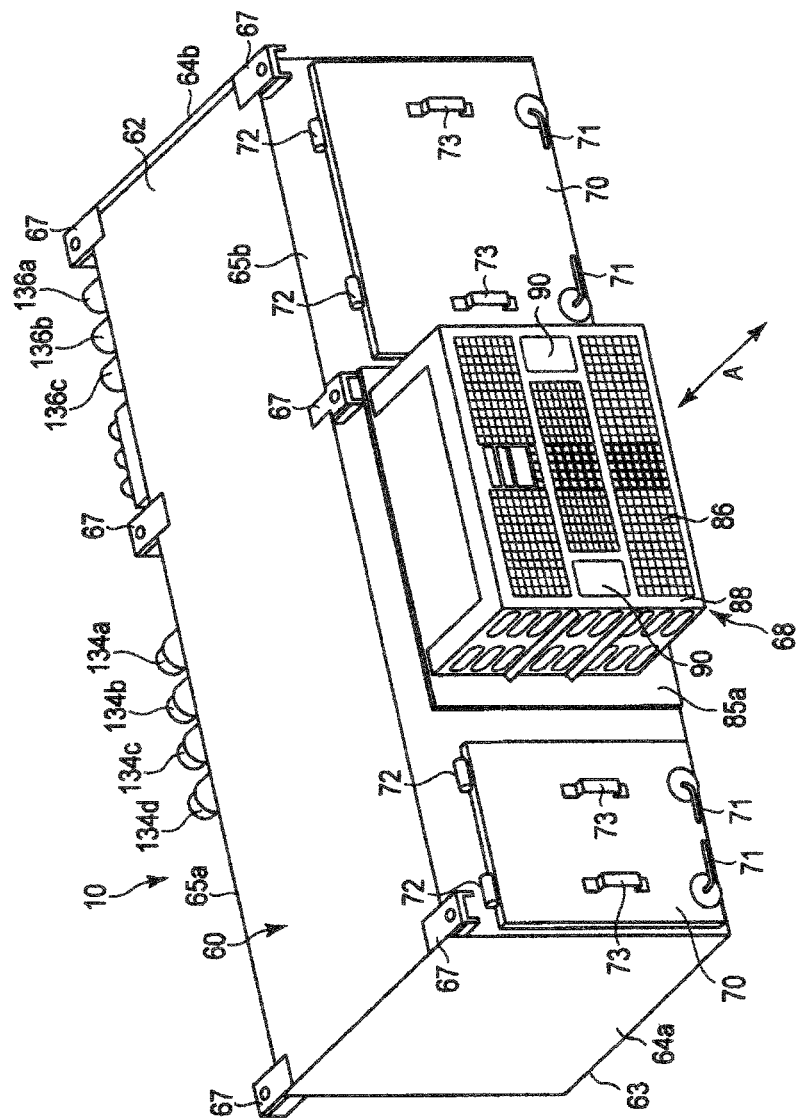
FIG. 5 is a perspective view showing an external view of said drive control equipment from a different direction.
Figure 6:
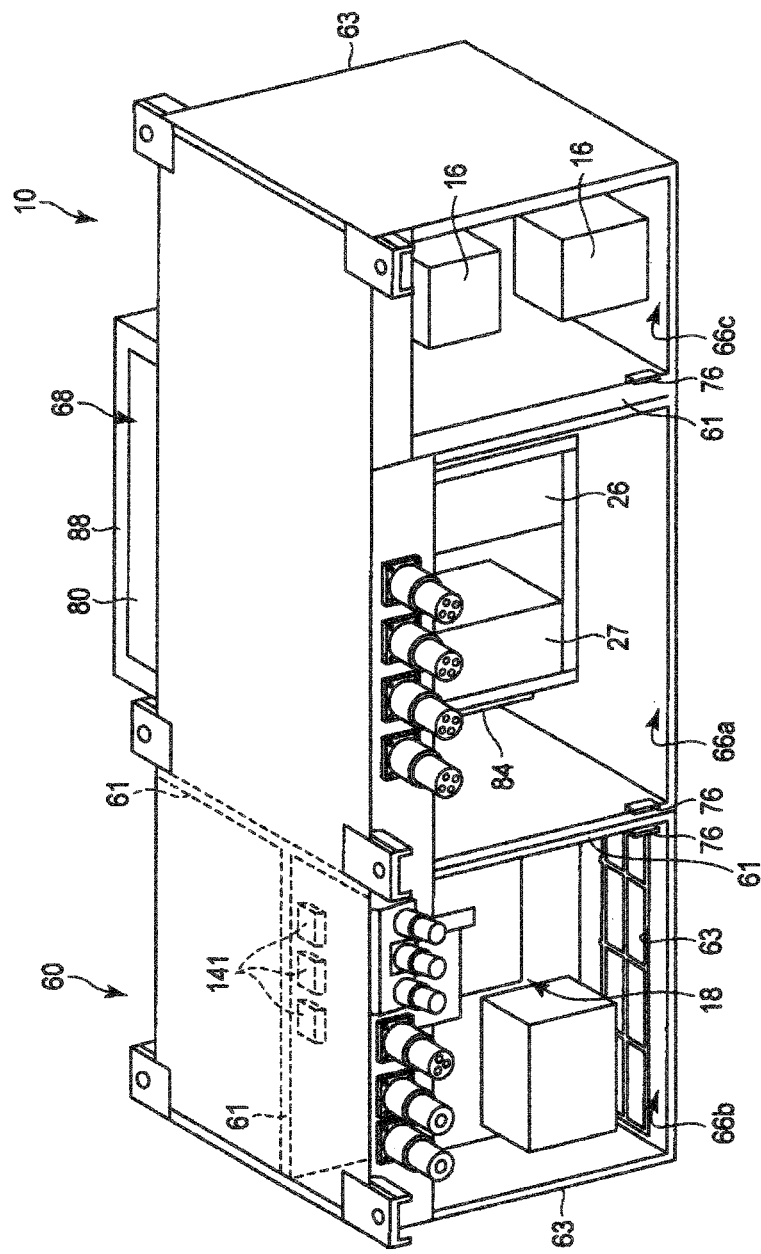
FIG. 6 is a perspective view showing the internal construction of said drive control equipment.
Figure 7:
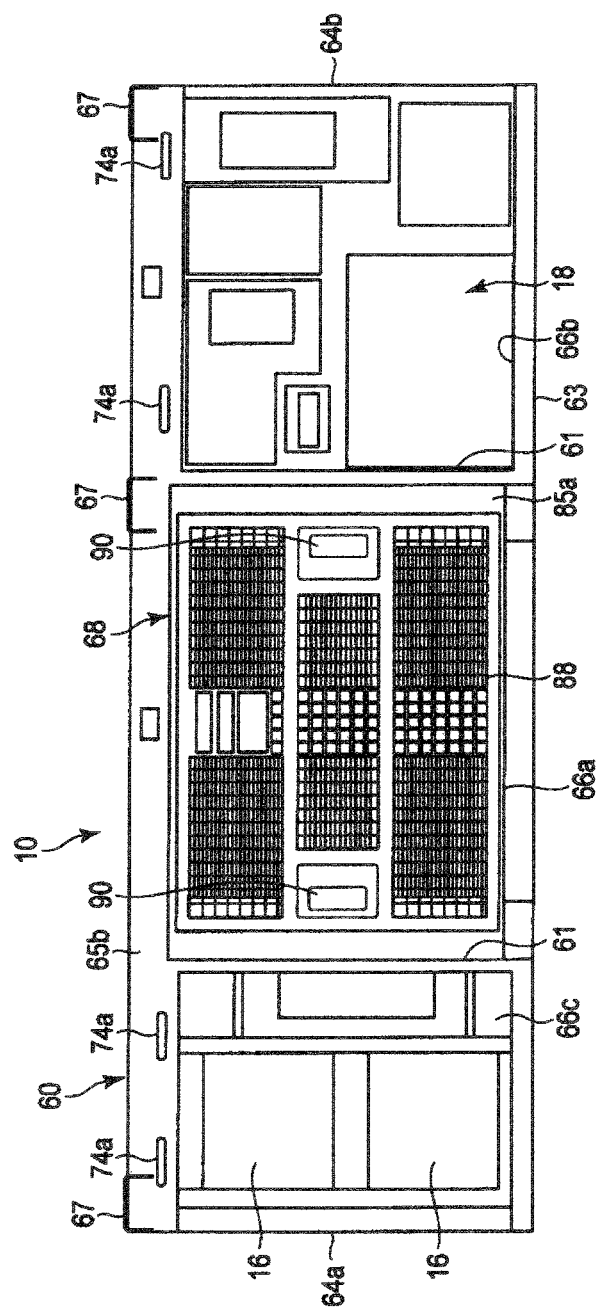
FIG. 7 is a side view of said drive control equipment.

FIG. 4 and FIG. 5 are perspective views showing an external view of the drive control equipment 10; FIG. 6 is a perspective view showing the internal construction of the drive control equipment with the equipment cover of the frame removed; FIG. 7 is a side view showing the internal construction of the drive control equipment with the equipment cover of the frame removed.

As shown in FIG. 4 to FIG. 7, the drive control equipment 10 comprises an elongate rectangular box-shaped frame 60. This frame 60 comprises: a plurality of rectangular frame-shaped main frames 61; an elongate rectangular ceiling wall 62 that is fixed to the main frame 61; an elongate rectangular bottom wall 63 that is parallel to and faces the ceiling wall that is fixed to the main frame 61; a pair of end walls 64a, 64b constituting both ends in the longitudinal direction of the frame, fixed to the main frame 61; and a pair of mutually facing sidewalls 65a, 65b that are fixed to the main frame so as to intersect with the end walls 64a, 64b at right angles. A plurality of suspension lugs 67 are mounted at the periphery of the ceiling wall 62 and the main frame 61. The frame 60 is stowed in the vehicle 8 by fixing these suspension lugs 67 to the side face below the body floor of the vehicle 8 (see FIG. 1). In the condition stowed below the floor of the vehicle 8, the ceiling wall 62 of the frame 60 faces the undersurface of the vehicle and the bottom wall 63 is positioned facing the ground surface and the side of a rail 7a.

As shown in FIG. 6, within the frame 60, there are defined a plurality, for example three, of accommodating sections, lined up in the longitudinal direction of the frame; these are: a first accommodating section (main accommodating section) 66a that is positioned in the middle; a second accommodating section (main accommodating section) 66b that is positioned at one end; and a third accommodating section (auxiliary accommodating section) 66c that is positioned at the other end. Within the first accommodating section 66a of the frame body, there are mainly accommodated four inverters and a power unit 68, to be later described; within the second accommodating section 66b, there is chiefly accommodated a control device 18; and within the auxiliary accommodating section 66c, there are chiefly accommodated four contactors 16.

As shown in FIG. 4 to FIG. 7, the pair of sidewalls 65a, 65b of the frame 60 have apertures facing the first, second and third accommodating sections 66a, 66b and 66c respectively: access to within the accommodating sections can be achieved through these apertures. Also, the frame 60 is provided with a plurality of equipment covers 70 whereby the apertures of the sidewalls can be opened/closed: these are mounted in freely rotatable, removable fashion on the respective sidewalls 65a, 65b.

(Construction of the Equipment Covers)

Each of the equipment covers 70 is formed by a rectangular plate whose peripheral section is bent at the side of the frame 60: for example, the top edges of each of the equipment covers 70 are freely rotatably supported on the side wall 65a or the side wall 65b by two or three hinges 72. In this way, the equipment covers 70 cover the apertures of the sidewalls and can be rotated between a closed position in which they constitute part of the side wall and an open position in which the aperture is open. A locking lever 71 that locks the equipment cover in the closed position is provided at the side of the bottom wall 63 of each equipment cover 70. In addition, a handle 73 that is employed when opening/closing and detaching/attaching the equipment cover is provided in the middle of the equipment cover 70.

Figure 8A:
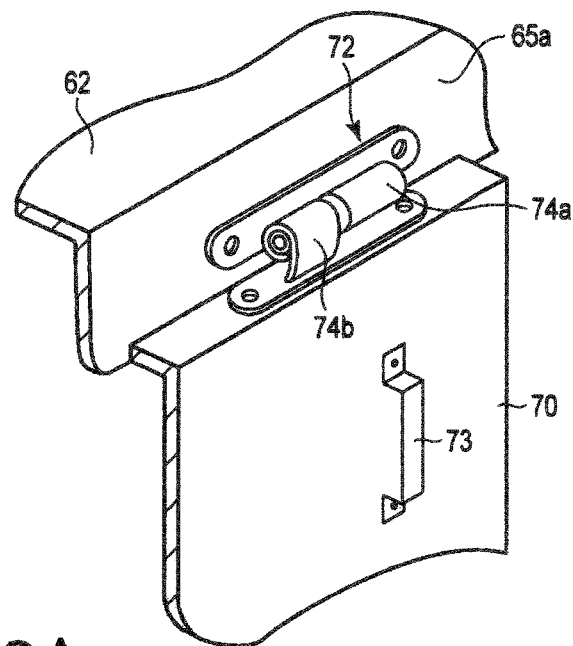
FIG. 8A and FIG. 8B is a perspective view showing to a larger scale a hinge that supports the equipment cover of said control equipment.
Figure 8B:
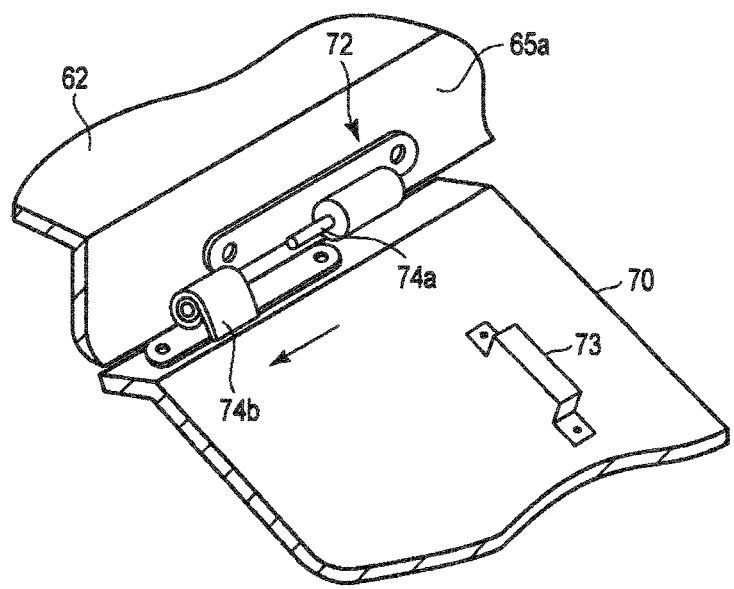
Figure 9:
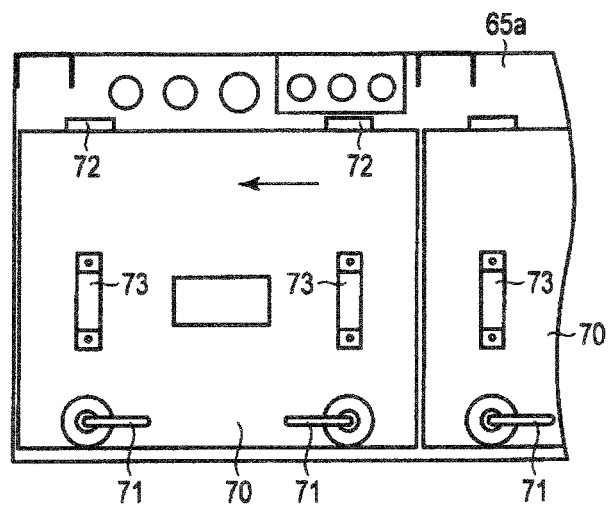
FIG. 9 is a side view showing the equipment cover of said drive control equipment.
Figure 10:
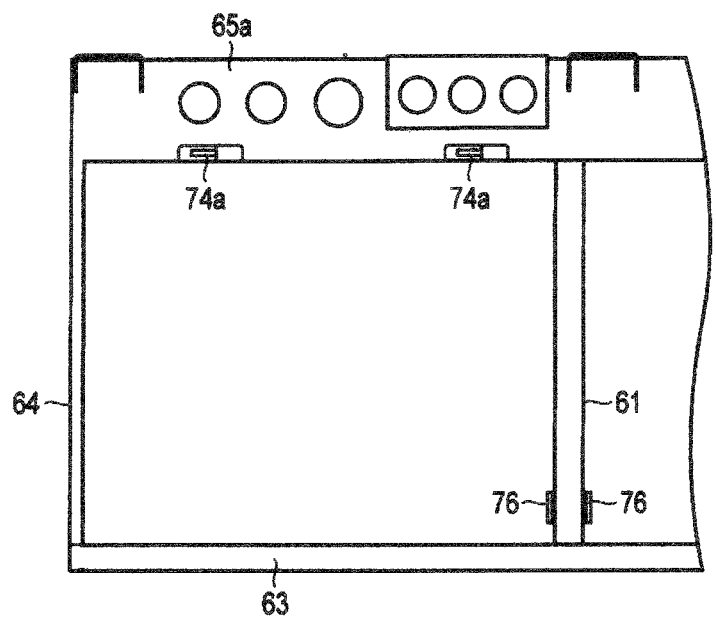
FIG. 10 is a side view showing the drive control equipment in a condition with the equipment cover removed.
Figure 11:
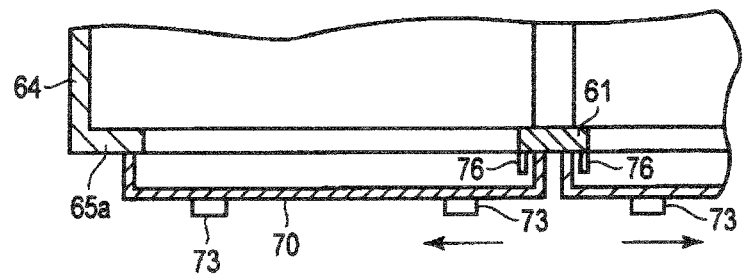
FIG. 11 is a cross-sectional view of an equipment cover portion of said drive control equipment.
Figure 12:
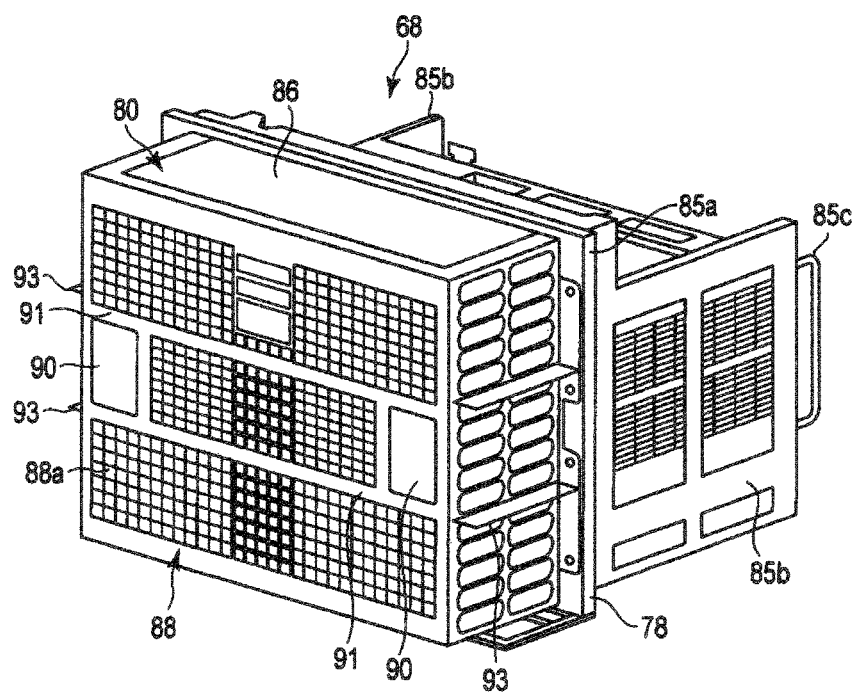
FIG. 12 is a perspective view showing a power unit of said drive control equipment.

As shown in FIG. 8A and FIG. 8B, each hinge 72 is provided with a pivot shaft 74a that is mounted on the sidewalls 65a, 65b of the frame 60 and a tubular acceptor 74b that is mounted on the equipment cover 70; the pivot shaft 74a is inserted in this acceptor 74b in a freely rotatable fashion and in a manner whereby it can be withdrawn along the axial direction. In this way, the acceptors 74b are freely rotatably supported on the pivot shaft 74a. Also, as shown in FIG. 8A, FIG. 8B, FIG. 9 and FIG. 10, the equipment cover 70 can be removed from the frame 60 by withdrawing the acceptors 74b from the bearings (axes) 74a by sliding the equipment cover 70 along the axial direction of the bearing (axis) 74a. It should be noted that a construction of the hinge 72 could also be adopted in which the bearing (axis) 74a is mounted on the side of the equipment cover 70 and the acceptor 74b is mounted on the sidewall side of the frame.

(Construction of the Stopper)

As shown in FIG. 6, FIG. 7, and FIG. 9 to FIG. 11, the frame 60 is provided with a stopper 74 to prevent unintended detachment of the equipment cover 70. The stopper 76 is formed by a metal plate that projects towards the side of the equipment cover 70 and is formed on the main frame 61. The stopper 76 engages the equipment cover when the equipment cover 70 that is closed in the closed position is moved in the withdrawal direction of the hinge 72, and thereby restricts movement of the equipment cover in the withdrawal direction. In this way, unintentional detachment of the equipment cover 70 can be reliably prevented. It should be noted that, by rotation of the equipment cover 70 towards the side of the open position, the stopper 76 becomes incapable of engagement with the equipment cover 70, so removal of the equipment cover 70 from the frame 60 can be achieved.

It should be noted that the stopper 76 need not necessarily be provided on the main frame 61, but could be provided on the equipment cover 70. In this case, when the equipment cover 70 is moved in the withdrawal direction, the stopper 76 comes into contact with the main frame 61, thereby restricting movement of the equipment cover.

(Construction of the Power Unit)

As shown in FIG. 5 to FIG. 6, the drive control equipment 10 comprises a power unit 68 that is mounted in the frame 60 and whereof part is arranged within a first accommodating section 66a. The power unit 68 is fixed in the frame 60 by being detachably inserted into the frame 60 through an aperture of the sidewall 65b. The direction A of this detachable insertion is a direction orthogonal to the width direction of the frame 60 and the side wall 65a.

FIG. 12 to FIG. 15 respectively show the power unit 68. As shown in these Figures, the power unit 68 comprises: a base frame 78; a cooler 80; a plurality of semiconductor elements (first to fourth switching elements 20u to 23u, 20v to 23v, 20w to 23w, and first and second diodes 24u, 25u, 24v, 25v, 24w, 25w) constituting four inverters 14 that are mounted in the cooler 80; first control boards 82 having first connectors 81; and second control boards 84 having second connectors 83 connected with the first connectors.

Figure 14:
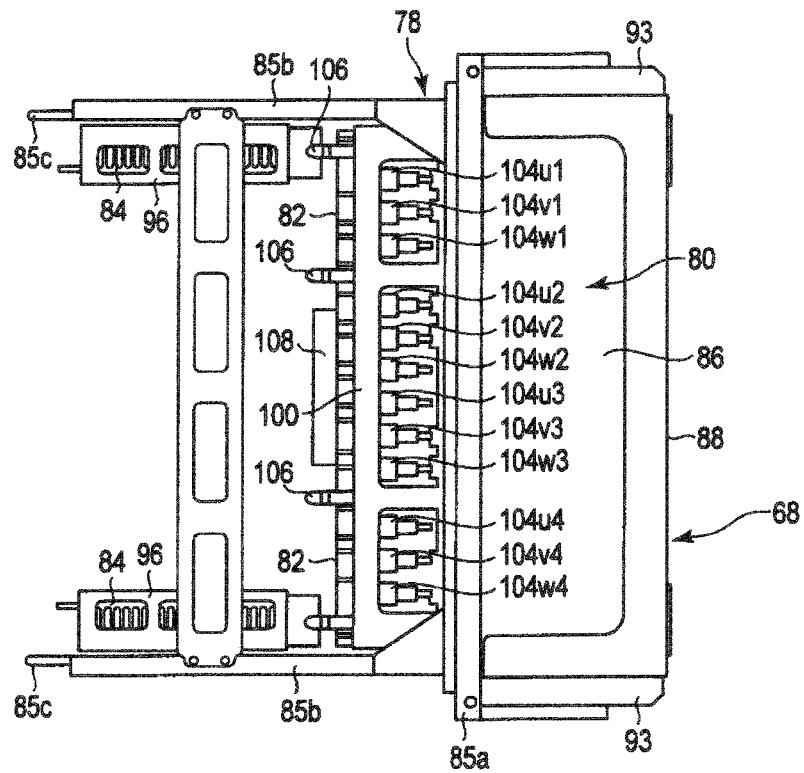
FIG. 14 is a plan view of said power unit.

The various components will be described below. As shown in FIG. 14, a base frame 78 comprises rectangular frames 85a and support frames 85b. The support frames 85b extend from the two side sections of the rectangular frames 85a in a direction (direction A of detachment/attachment of the power unit 68) orthogonal to the respective rectangular frames 85a. Handles 85c are mounted at the extension ends of the support frames 85b.

Figure 13:
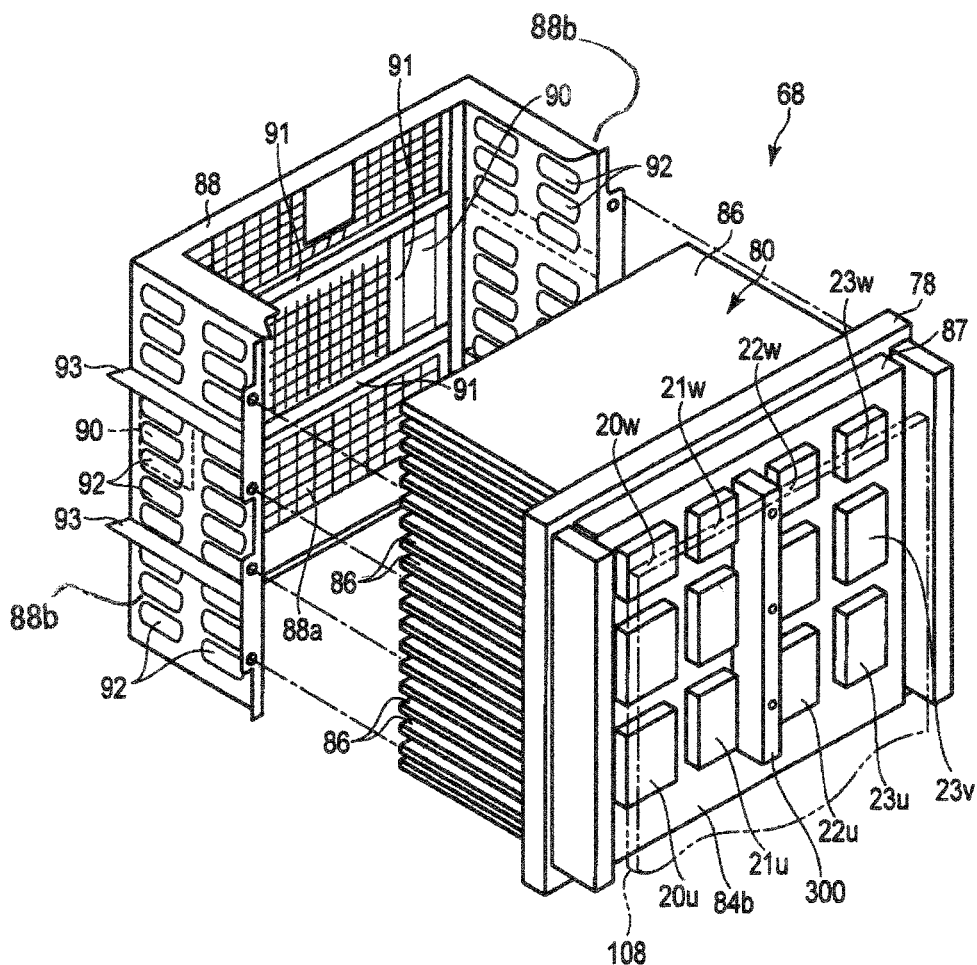
FIG. 13 is an exploded perspective view showing a cooler and shroud of said power unit.

Also, as shown in FIG. 13, a cooler 80 is provided with a rectangular plate-shaped cooling block 87 formed of material of high thermal conductivity such as for example aluminum, and a large number of radiating fins 86 that are erected on one side face of the cooling block 87; the cooling block 87 is fixed at its periphery to the rectangular frames 85a and is arranged within the rectangular frames 85a.

The cooling block 87 is constituted so as to be integral with the radiating fins 86. The material of the radiating fins 86 is material of high conductivity, such as for example aluminum. The longitudinal direction of the large number of radiating fins 86 extends substantially parallel with the direction of travel of the vehicle 8 and the fins are lined up with prescribed gaps from the rail vehicle 8 in the direction of the rails 7a. Also, in a condition in which the power unit 68 is mounted in the frame 60, the radiating fins 86 project to outside the frame 60. Consequently, the traveling wind that is generated when the vehicle 8 travels can blow through between the radiating fins 86.

The face of the cooling block 87 opposite to the face where the radiating fins 86 are mounted forms a heat-sink face 84b. A plurality of semiconductor elements (first to fourth switching elements 21u, 22u, 21v, 22v, 21w, 22w) are arranged on this heat-sink face 84b, lined up with mutual gaps, with heat-conducting grease or the like arranged between these and the heat-sink face.

Also, an elongate square pillar-shaped insulator 300 is fixed between a plurality of semiconductor elements on the heat-sink face 84b of the cooling block 87; PN input terminals 108, to be later described, are fixed, by for example screwing in, to this insulator. These PN input terminals 108 are connected with a plurality of semiconductor elements (first to fourth switching elements 21u, 22u, 21v, 22v, 21w, 22w). The provision of this insulator 300 ensures that, when any of the semiconductor elements fails, this failed semiconductor element is prevented from damaging other, normal semiconductor elements. Also, fixing of the insulator 300 makes it possible to prevent deformation etc of the PN input terminals 108.

(Construction of the Shroud (Fin-Cover))

The power unit 68 is provided with a shroud (sometimes also called fin-cover) 88 of a shape such as to cover the radiating fins 86, in order to protect the radiating fins 86. This shroud (fin-cover) 88 is formed in substantially U shape by a rectangular front face section 88*a* and two rectangular side face sections 88*b* that are connected with both ends of the front face section 88*a*. The front face section 88*a* is located at the end on the opposite side to the end where the radiating fins 86 contact the cooling block 87 i.e. on the side of the end of the extension of the radiating fins 86; the side face 88*b* is located on the air inlet side and outlet side of the traveling wind of the radiating fins 86. This shroud (fin-cover) 88 is fixed by bolts or the like to the rectangular frames 85*a* of the base frame 78. Also, the shroud (fin-cover) 88 is provided with an aperture, at which the radiating fins 86 are left uncovered, on the side of the rail vehicle 8 and the rails 7*a*.

The front face section 88*a* of the shroud (fin-cover) 88 is in mesh form, with the exception of the peripheral section thereof. In addition, two handles 90 and reinforcement ribs 91 to reinforce the periphery of these handles are provided on the front face section 88*a*. When attached/detaching the power unit 68 with respect to the frame 60, this can be achieved by pushing in/pulling out the power unit by holding the handle 90. A large number of through-holes 92 for permitting passage of the traveling wind are formed in both side face sections 88*b* of the shroud (fin-cover) 88. These through-holes 92 are constituted for example by elongate slots extending in the direction of attachment/detachment of the power unit 68. Also, a plurality of reinforcement ribs 93 extending in the attachment/detachment direction are provided in the side face sections 88*b* between the through-holes 92.

In this way, even though the shroud (fin-cover) 88 is provided with a handle 90 and is provided with reinforcing ribs 91, 93 to enable it to withstand the attachment/detachment operation, owing to the construction whereby the shroud (fin-cover) 88 is open at the top end and bottom end of the radiating fins 86, increase in weight of the shroud (fin-cover) 88 can be suppressed. Also, in view of the fact that the radiating fins 86 are accessible to hand contact, their potential is set to earth potential.

(Construction of the First Control Boards)

Figure 15:
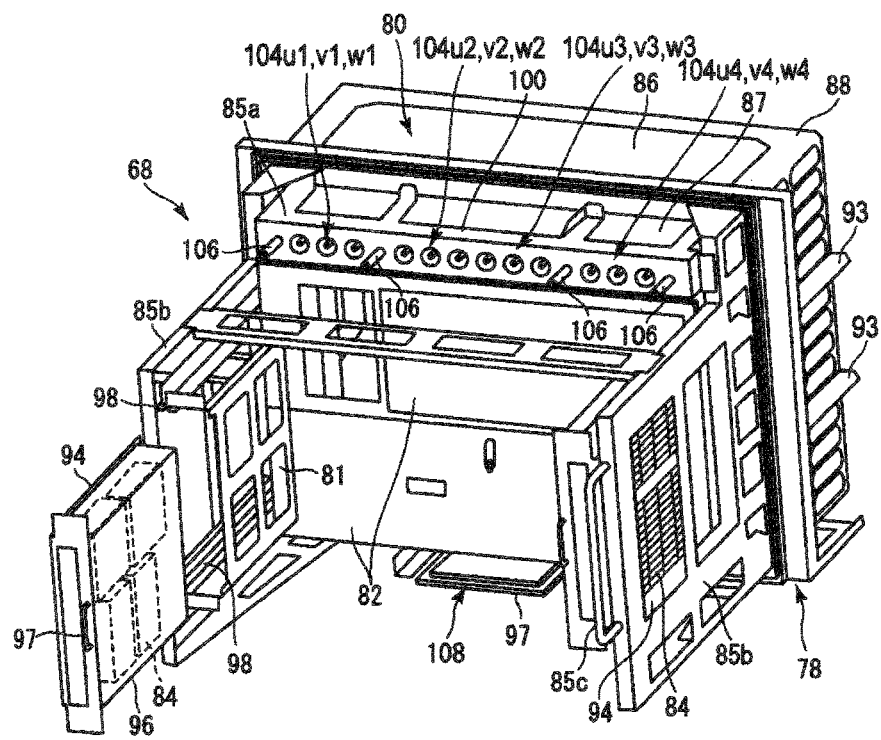
FIG. 15 is a perspective view of said power unit seen from the side of a first control board.
Figure 17:
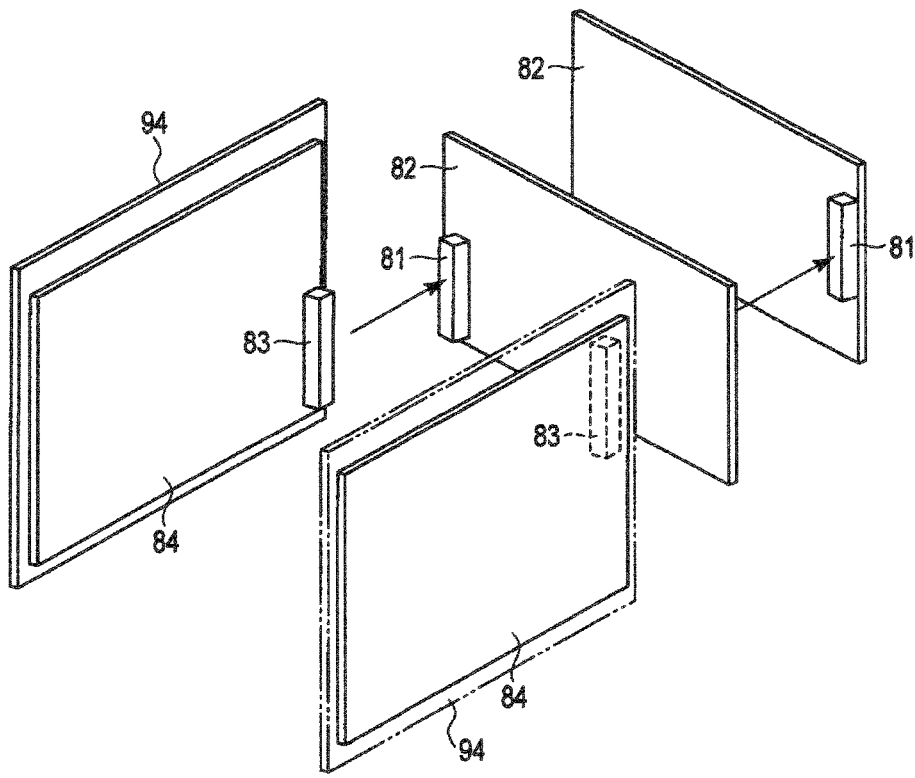
FIG. 17 is an exploded perspective view showing the first control board and second control board of said power unit.
Figure 18:
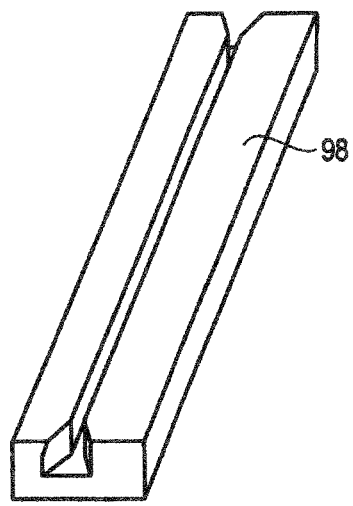
FIG. 18 is a perspective view showing a guide rail of said power unit.
Figure 19:
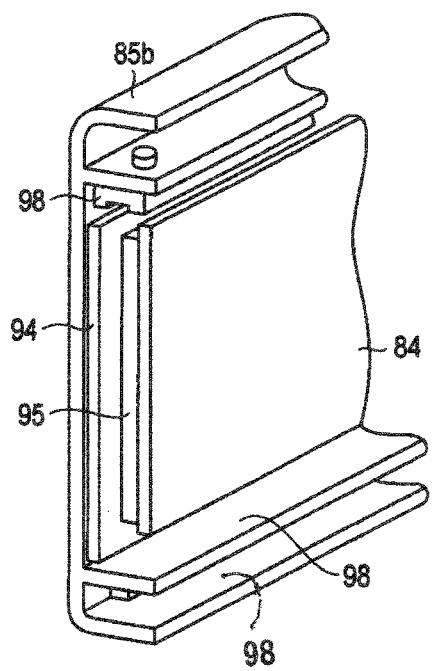
FIG. 19 is a perspective view showing the second control board and a support frame of said power unit.

Next, the two first control boards 88 that are connected with the semiconductor elements on the cooling block 87 will be described. As shown in FIG. 14, FIG. 15 and FIG. 17, the two first control boards 82 are mounted on the base frame 78, being arranged above and below on the side of the vehicle 8 and the side of the rails 7*a*, in a substantially parallel fashion so as to face the heat-sink face 84*b* of the cooling block 87. These first control boards 82 are for example gate amplification boards and are connected with the semiconductor elements of each inverter 14, so as to output switching signals. First connectors 81 are provided on the back face and the outer peripheral side of the first control boards 82.

(Construction of the Second Control Boards)

Figure 16:
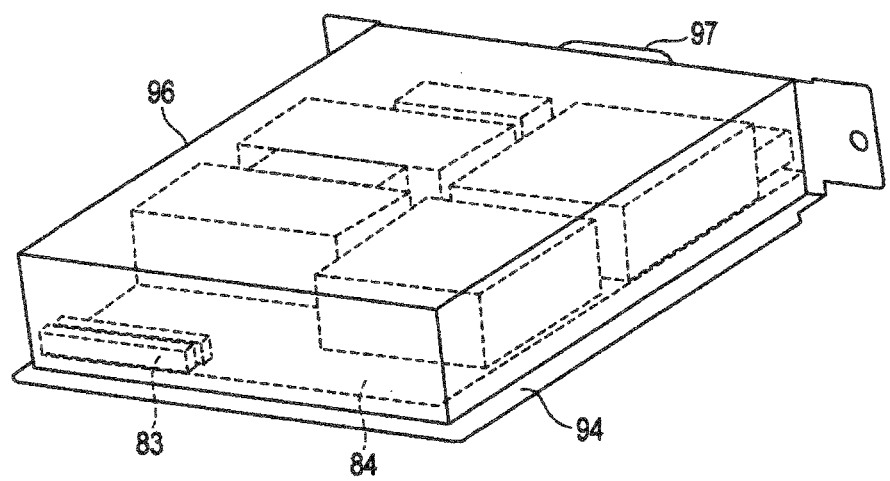
FIG. 16 is a perspective view of said power unit showing said second control board.

The two second control boards 84, having second connectors 83 that are connected with the aforementioned first connectors 81 will now be described. These second control boards 84 are for example gate control boards that output control signals to the gate amplification boards. As shown in FIG. 14, the power unit 68 is provided with two second control boards 84: these second control boards 84 are respectively freely slidably mounted on two support frames 85*b* of the base frame 78. In more detail, as shown in FIG. 14 to FIG. 19, the second control boards 84 are mounted, with an insulating layer 95 therebetween on rectangular support boards (support base plates) 94 that are slightly larger than these second control boards 84. Also, as shown in FIG. 15 and FIG. 16, a mesh-like cover 96 that covers the second control boards 84 is mounted on the support boards 94. In addition, one end of the support boards 94 is bent at right angles on the side of the second control board 84 and a handle 97 is mounted on this bent section. A second connector 83 is provided at the end of the second control board 84 on the opposite side to that of the handle 97.

Furthermore, a pair of upper and lower guide rails 98 having a recess in the middle thereof are mounted on the support frames 85*b* of the base frame 78. The upper and lower guide rails 98 extend in the longitudinal direction of the support frames 85*b* and are positioned mutually parallel so that their recesses face each other. Also, both side edges of the support boards 94 of the second control boards 84 engage with the recessed portions of the respective guide rails 98, so that they can be slid along the guide rails to the vicinity of the first control boards 82. Thus the second control boards 84 are supported by the support frames 85*b* in such a way that they can be freely inserted or removed, by engagement with the recesses of the guide rails 98. The two second control boards 84 that are mounted along the guide rails 98 have second connectors 83 in mutually different positions, so as to be coupled with the first connectors 81 of the first control boards 82 that are positioned in the vertical direction on the side of the cooling block 87. In this way, the two second support boards 84 are arranged in an opposing fashion in a direction orthogonal to the first control boards 32 and in a manner such that a gap is left between these second support boards 84.

In this way, the space in the second accommodating section can be effectively utilized by arranging the first control boards 82 and the second control boards 84 in mutually orthogonal directions. Also, inspection and maintenance of the first and second control boards 82, 84 can be facilitated by providing the second control board 84 in a direction orthogonal to the first control board 82 but without overlapping. By directly connecting the first control board 82 and the second control board 84 by means of the first connector 81 and second connector 83, connecting wiring or the like becomes unnecessary, making it possible to reduce the installation space and reduce manufacturing costs. Furthermore, by freely slidably supporting the second control board 84 and a connector connection with the first control board 82, attachment/detachment of the second control board 84 can be facilitated and assembly, inspection and maintenance can easily be performed. Also, by adopting a construction in which the second control board 84 is mounted on a support board 84 and this support board is freely slidably supported on the base frame, the possibility of direct sliding of the second control board 84 on the guide rail 98 can be eliminated, thereby making it possible to prevent damage to the second control board 84 caused by sliding.

(Construction of the Connector)

Figure 20:
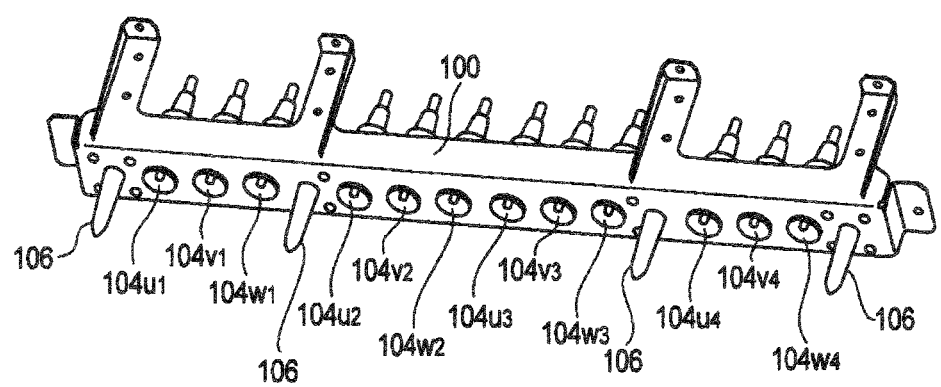
FIG. 20 is a perspective view showing a connector support frame and output connector of said power unit.

Also, as shown in FIG. 14, FIG. 15, FIG. 18, FIG. 19, FIG. 20, FIG. 21, the power unit 68 comprises a connector support frame 100 and output connectors 104*u*1 to 104*w*4. The connector support frame 100 is an elongate connector support frame that extends in the direction orthogonal to the direction A of attachment/detachment of the power unit 68 (i.e. direction parallel with the heat-sink face 84 of the cooler 80). The output connectors 104*u*1 to 104*w*4 are mounted on the connector support frame 100 on either side of an insulating plate 102 made of for example epoxy. The connector support frame 100 and output connector are provided at the top of the power unit 68 i.e. in the vicinity of the ceiling wall 62 of the frame 60. As shown in FIG. 20, the output connectors include: three output connectors 104*u*1, v1, w1; three output connectors 104*u*2, v2, w2; three output connectors 104*u*3, v3, w3 and three output connectors 104*u*4, v4, w4 that are respectively connected with the U, V, W outputs of the four inverters 14. These output connectors 104*u*1 to 104*w*4 are arranged in a row along the longitudinal direction of the connector support frame 100, with mutual gaps therebetween.

(Construction of the Connector Locating Pins)

Figure 21:
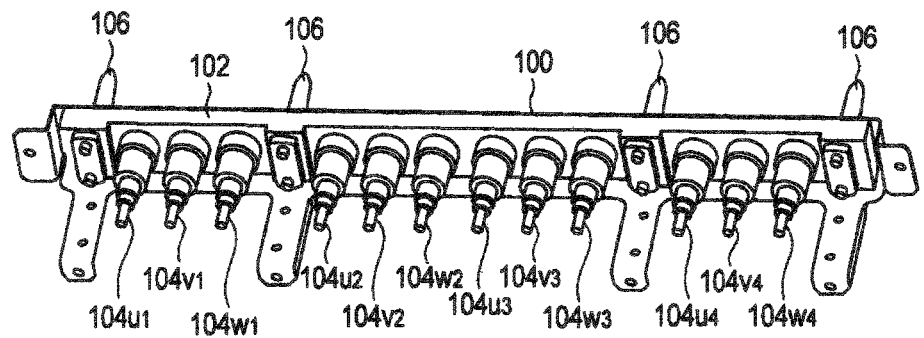
FIG. 21 is a perspective view showing said connector support frame from the rear side.

Also, as shown in FIG. 20 and FIG. 21, a plurality of locating pins 106 are erected between the output connectors 104*u*1 to 104*w*4 of the connector support frame 100, and extend from the connector support frame in the direction A of attachment/detachment of the power unit 68. Locating pins 106 are respectively provided at one end of the row of output connectors and another end thereof, and between the output connectors 104*w*1, 104*u*2 and also between the output connectors 104*w*3, 104*u*4.

By inserting and mounting the power unit 68 in the frame 60, the locating pin 106 engages with position-locating holes of the connector support frame provided on the side of the frame 60 and thereby positionally locates the output connectors 104*u*1 to 104*w*4 with respect to the connectors provided on the side of the frame 60; the output connectors 104*u*1 to 104*w*4 are then respectively fitted into the connectors on the side of the frame.

(Construction of the PN Input Terminals of the Power Unit)

Figure 22:
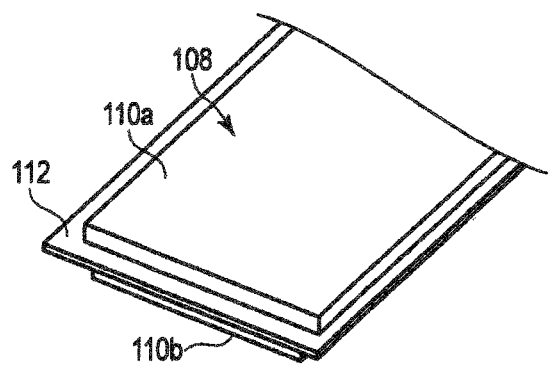
FIG. 22 is a perspective view showing PN input terminals of said power unit.
Figure 23:
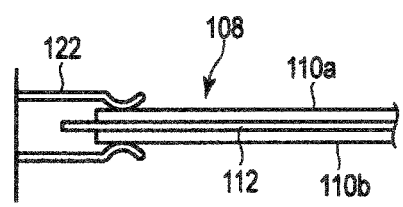
FIG. 23 is a cross-sectional view of said PN input terminal.

As shown in FIG. 14 and FIG. 15, the power unit 68 comprises PN input terminals 108 constituted by a DC positive electrode terminal P and a DC negative electrode terminal N, for supplying current to the inverters 14. These PN input terminals 108 are provided below the power unit 68 i.e. at the side of the bottom wall 63 of the frame 60. As shown in FIG. 22 and FIG. 23, the PN input terminals 108 comprise a plate-shaped positive electrode terminal 110*a* and a plate-shaped negative electrode terminal 110*b* that is formed substantially of the same size as this positive electrode terminal; this positive electrode terminal 110*a* and negative electrode terminal 110*b* are mutually superimposed, gripping an insulating layer 112 therebetween, and extend mutually along the same direction. For example, an insulating layer 112 formed by epoxy or the like has an area that is larger than that of the positive electrode terminal 110*a* and negative electrode terminal 110*b* and extends outwards by a prescribed width from the periphery of the positive electrode terminal 110*a* and negative electrode terminal 110*b*. The PN input terminals 108 are mounted for example on the base frame 78 and extend in the attachment/detachment direction A from this base frame, beyond the first control board 82. Thus the PN input terminals 108 extend substantially parallel with the bottom wall 63 of the frame 60.

In this way, the PN input terminals 108 are constituted as connectors by adopting a construction wherein the positive electrode terminal 110*a* and the negative electrode terminal 110*b* are arranged in a mutually overlapping fashion and extend along each other for their entire length. These PN input terminals 108, constituted as connectors, can thus easily be slide-fitted onto coupling sections (connecting terminals 122) that are provided on the filter capacitors 26, 27. Also, the inductance can be reduced by adopting a construction in which the positive electrode terminal 110*a* and negative electrode terminal 110*b* are arranged in a mutually overlapping fashion and extend mutually along their entire length.

By providing the PN input terminals 108 and the aforementioned output connectors 104*u*1 to 104*w*4 separately above and below the power unit 68, inflow of noise to the output connectors from the PN input terminal side is suppressed. Also, compared with the case where the PN input terminals 108 and the aforementioned output connectors 104*u*1 to 104*w*4 are arranged in adjacent fashion, the dimensions of the power unit 68 in the width direction can be reduced. Also, by arranging the output connectors 104*u*1 to 104*w*4 on the side of the ceiling wall 62 of the frame 60 and arranging the PN input terminals 108 on the side of the bottom wall 63 of the frame 60, inflow of external noise from the rails, through which for example signal current flows, or the ground, can be prevented.

(Construction of the Filter Capacitors)

Figure 24:
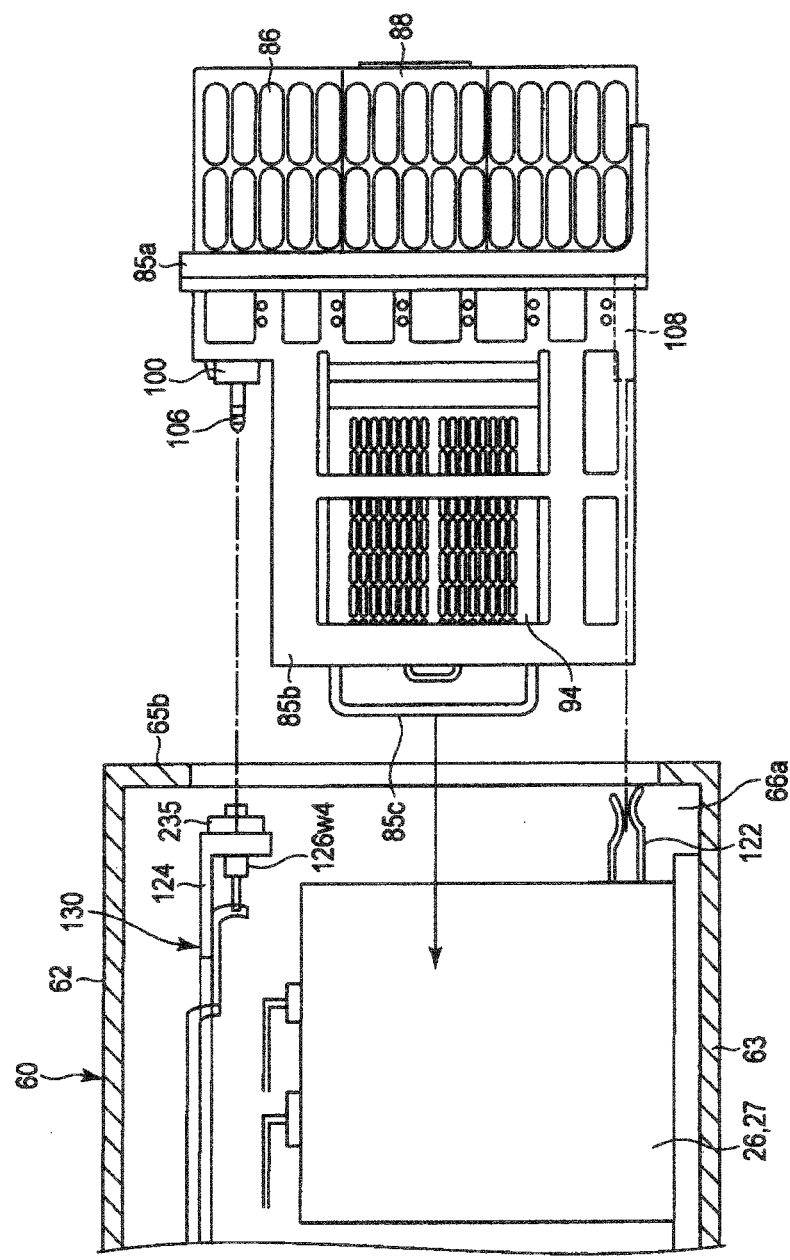
FIG. 24 is a side face view showing said power unit and a frame.

Next, the filter capacitors 26, 27, that have coupling sections with the PN input terminals 108, as described above, will be described. As shown in FIG. 6, the plurality of filter capacitors 26, 27 constituting the inverters 14 in the first accommodating section 66*a* of the frame 60 are arranged on the bottom wall 63. As shown in FIG. 24, these filter capacitors 26, 27 have connecting terminals 122 that are capable of coupling with the PN input terminals 108 of the power unit 68. The filter capacitors 26, 27 are arranged so as to be located between the two second control boards 84 when the power unit 68 is mounted in the frame 60. Also, the filter capacitors 26, 27 are connected with the power source through high-voltage side connectors, to be later described.

Figure 25:
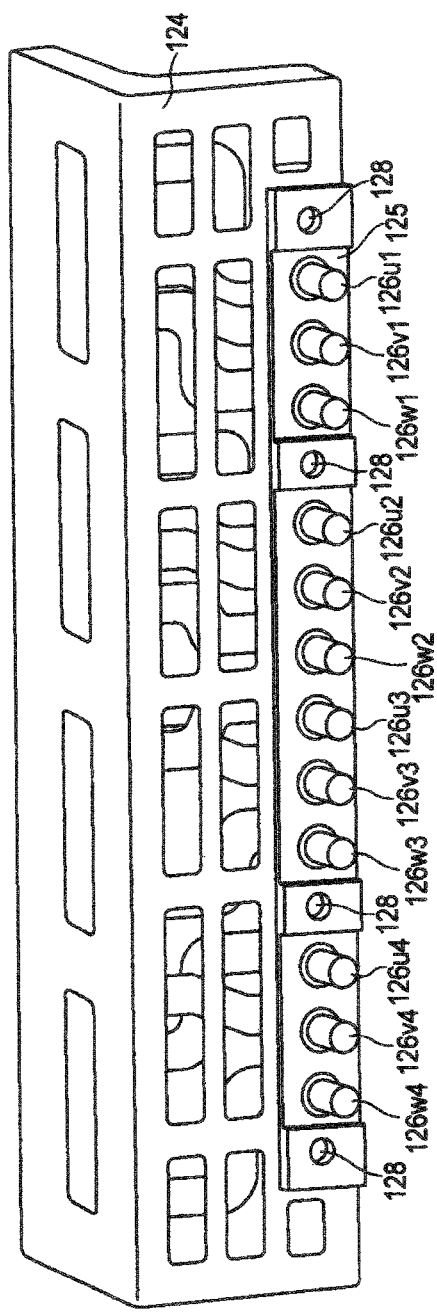
FIG. 25 is a perspective view showing a connector support frame on the side of said frame and an input connector.
Figure 26:
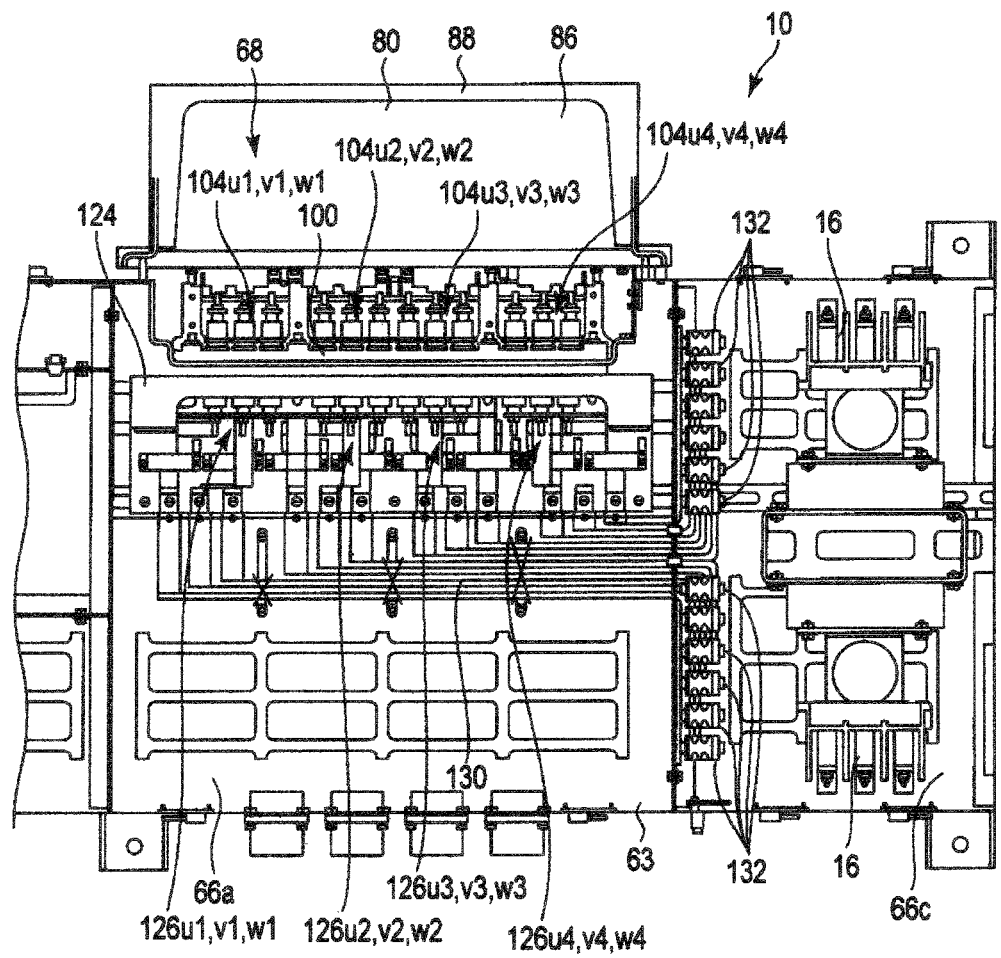
FIG. 26 is a cross-sectional view of the drive control equipment showing said power unit and a connector connection portion of the frame.

As shown in FIG. 24 to FIG. 26, an elongate support frame 124 is provided within the first accommodating section 66*a* of the frame 60, and extends in a direction orthogonal to the direction A of attachment/detachment of the power unit 68. The connector support frame 124 is arranged adjacently in an opposed fashion, parallel with the connector support frame 100 of the power unit 68.

A plurality of input connectors 126 are mounted on the connector support frame 124, sandwiching insulating plates 125 made of epoxy or the like. This plurality of input connectors 126*u*1 to 126*w*4 (three input connectors 126*u*1, v1, w1; three input connectors 126*u*2, v2, w2; three input connectors 126*u*3, v3, w3; and three input connectors 126*u*4, v4, w4) are arranged along the longitudinal direction of the connector support frame 124 lined up in a single row and with mutual gaps therebetween. As mentioned above, the connectors that are coupled with these input connectors 126*u*1 to 126*w*4 are the output connectors 104*u*1 to 104*w*4. Also, as shown in FIG. 25, a plurality of position location holes 128 are formed in the connector support frame 124 and an insulating plate 125. The position location holes 128 are respectively formed at the end of the row of input connectors and another end, between the input connectors 104*w*1, 104*u*2, and between the input connectors 104*w*3, 104*u*4.

As shown in FIG. 26, a plurality of conductors 130 are mounted on the connector support frame 124; the ends of each conductor are respectively connected with the input connectors 104*u*1 to 126*w*4. Also, the other ends of the plurality of conductors 130 are connected with a plurality of connectors 132 that are respectively provided on the side of the contactors 16; and, in addition, are connected with the plurality of contactors 16 through these connectors 132.

(Construction of the Locating Pins)

Figure 27:
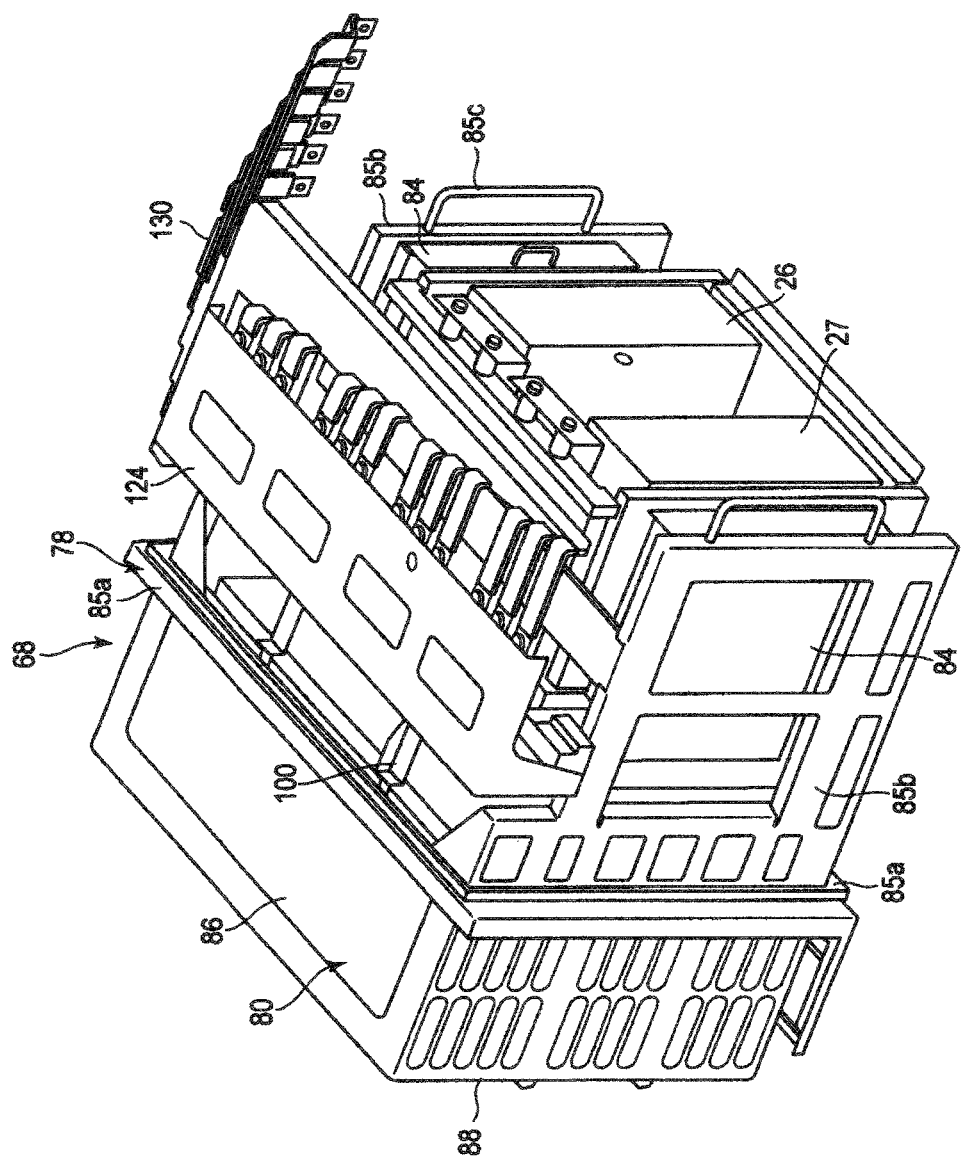
FIG. 27 is a perspective view showing said power unit and a structural element on the frame side connected with this power unit.
Figure 28:
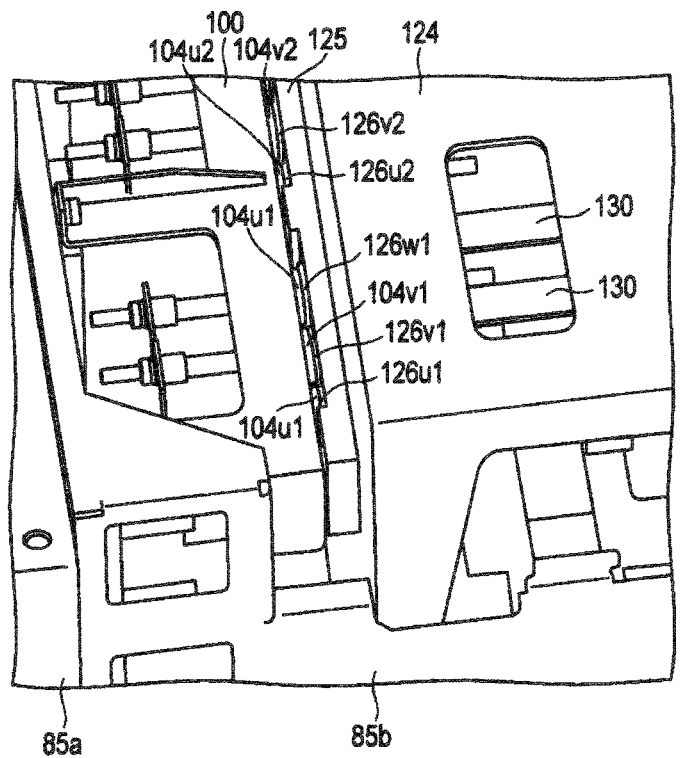
FIG. 28 is a perspective view showing the connection condition of the input connector on the frame side with the output connector of said power unit.

As shown in FIG. 24, the power unit 68 is inserted and mounted from a sidewall aperture of the frame 60 into the first accommodating section 66*a* of the frame 60. As shown in FIG. 26 to FIG. 28, in the course of this mounting, the locating pins 106 on the side of the power unit 68 are respectively inserted in the position location holes 128 of the connector support frame 124 on the side of the frame 60. By coupling of the locating pins 106 and the position locating holes 128, the respective input connectors 126u1 to 126w4 on the side of the frame are located in position so as to face the output connectors 104u1 to 104w4 on the side of the power unit 68. Thus the output connectors 104u1 to 104w4 on the side of the power unit 68 are respectively fitted into the input connectors 126u1 to 126w4 on the side of the frame 60, by further insertion of the power unit 68 as far as a prescribed position of the frame 60, following the guidance provided by the locating pins 106 and the position location holes 128. At the same time, a conductive connection is achieved by engagement of the PN input terminals 108 of the power unit 68 with the connection terminals 122 of the filter capacitors 26, 27. In this way, the inverters 14 provided in the power unit 68 are connected with the respectively corresponding contactors 16 and connected with the power source 19 through the filter capacitors 26, 27 (connected with the power source through the pantograph, fuse and switch).

(Power Unit as a Whole)

As shown in FIG. 5 to FIG. 7 and FIG. 27, the power unit 68 mounted in the frame 60 is arranged in the prescribed position by fixing the rectangular frames 85a to the side wall 65b of the frame 60 and the main frame 61. The radiating fins 86 and shroud (fin-cover) 88 of the power unit 68 are positioned outside the frame 60 so as to be capable of receiving the traveling wind of the vehicle. The other portions of the power unit 68 are arranged within the first accommodating section 66a of the frame 60. The two second control boards 84 that are mounted in the power unit 68 are arranged on both sides of the filter capacitors 26, 27 so that an efficient arrangement of the filter capacitors and the main frame 61 in the comparatively narrow space is achieved. Also, extending ends of the second control boards 64 are arranged in the vicinity of the sidewalls 65a on the opposite side of the frame 60. Consequently, inspection and maintenance of the second control board 64 can be achieved from the aperture side of the sidewalls 65a and the second control boards 64 can be withdrawn/inserted with respect to the power unit 68, by removing the equipment cover 70.

Miniaturization of the drive control equipment 10 can thus be achieved by reducing the installation space by efficient arrangement of the power unit 68 within the first accommodating section 66a. Also, maintenance and inspection of the power unit 68 can easily be performed. Furthermore, reduction in the size and weight of the power unit 68 can be achieved and the operation of detachment/attachment of the power unit 68 can be facilitated, by, of the elements constituting the inverter 14, placing the filter capacitors 26 and 27, which are of relatively large size and weight, on the bottom wall 63 of the frame 60, and arranging the other constituent elements of the inverter 14 in the power unit 68, so as to make it possible to connect these with the filter capacitors through connectors and output terminals.

(Construction of the External Connectors)

Figure 29:
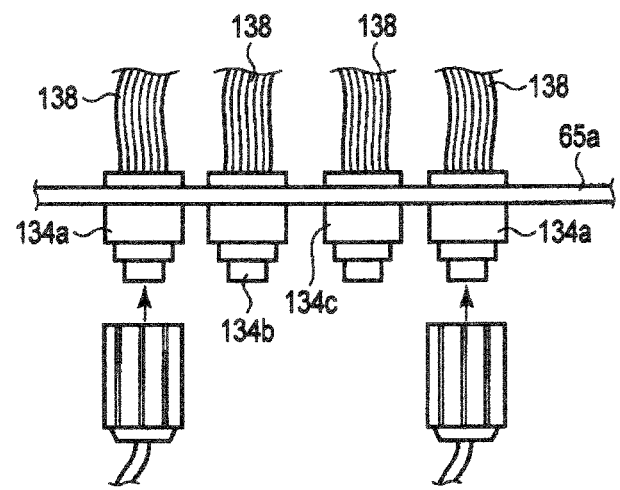
FIG. 29 is a plan view showing a link connector mounted on said frame.

As shown in FIG. 4, FIG. 6 and FIG. 29, on the outside of the sidewalls 65a of the frame 60 and on the side of the rail vehicle 8, there are mounted a plurality, for example four, of high-voltage side connectors (link connectors) 134a, 134b, 134c, 134d, and a plurality, for example three, of high-voltage side connectors (link connectors) 136a, 136b, 136c. The high-voltage side connectors 134a, 134b, 134c, 134d are provided through the frame 60, facing the first accommodating section 66a and are directly connected with the outputs of the four contactors 16 by wirings 138 arranged in the frame 60. The high-voltage side connectors 134a, 134b, 134c, 134d are for example screw-in type connectors; a link connector 140 connected with the motor 12 is connected and fixed thereto from the side of these high-voltage side connectors.

The high-voltage side connectors 136a, 136b, 136c are arranged facing the second accommodating section 66b, so as to pass through the frame 60. The high-voltage side connector 136a is connected with wiring within the frame 60 and this wiring is directly connected with the filter capacitors 26, 27. The high-voltage side connectors 136a, 136b, 136c are for example screw-in type connectors; a link connector connected with a high-voltage line, not shown, is connected and fixed to these high-voltage side connectors.

In this way, by providing the connectors outside the frame 60 and connecting these connectors directly with the internal equipment through a wiring, the need to provide a terminal block within the frame is obviated, and the installation space that needs to be provided within the frame can be reduced. Also, waterproofing of these connectors can be achieved solely by means of rubber packing, so the need, as conventionally, to lead the wiring to the outside through the walls of the frame 60 and to seal these leading-out portions, is eliminated: thus improved ease of assembly, reduced manufacturing costs and reduced installation space can be achieved. The connectors need not necessarily be of the screw-in type, and connectors of other types, such as push-fit connectors could be employed.

(Arrangement of the Earthing Capacitors)

Figure 30:
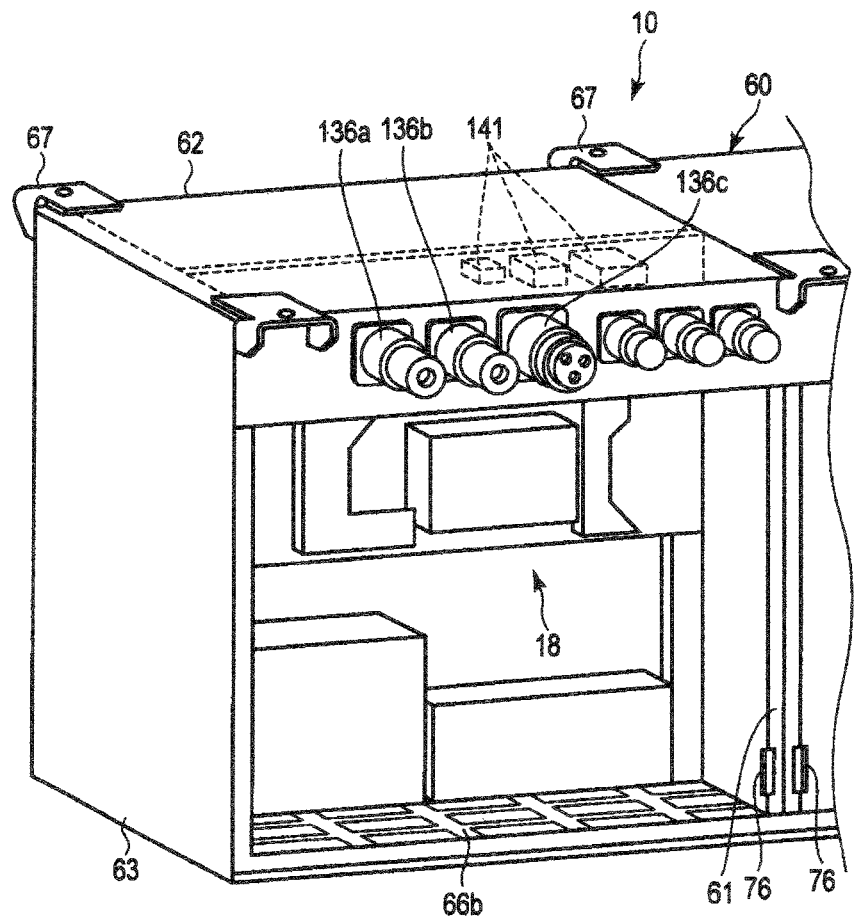
FIG. 30 is a perspective view of a control device of said drive control equipment.

As shown in FIG. 6 and FIG. 30, the control device 18 comprises various equipment accommodated in the second accommodating section 66b of the frame 60. Also, the control device 18 comprises a plurality, for example three, of earthing capacitors 141; these earthing capacitors 141 are arranged on the inside face side of the ceiling wall 62 within the second accommodating section 66b. These earthing capacitors 141 may well constitute a source of noise and so are installed on the ceiling wall 62, and the high-voltage leads (lines), motor frame earth lead (line), or power unit earth lead (line) and other high-voltage or low-voltage leads (lines) or the like are arranged so as not to run in the same direction. In this way, the effect of noise from the earthing capacitors 141 on the control device 18 can be minimized.

(Arrangement of the Contactors)

As shown in FIG. 6, FIG. 7 and FIG. 26, the four contactors 16 are arranged within the third accommodating section 66c of the frame 60. Two of the contactors 16 are arranged on the sidewall 65a and two of the contactors 16 are arranged on the sidewall 65b: these contactors are arranged parallel with each other in the vertical direction of the frame 60 (direction of the rail 7a from the vehicle 8). By thus arranging the four contactors in parallel with each other in the width direction and height direction, the contactors can be efficiently accommodated in a restricted installation space and reduction in the size of the frame 60 can thereby be achieved.

By means of drive control equipment 10 for a vehicle constructed in this way, increase in size can be kept down and manufacturing costs can be reduced.

Next, drive control equipment according to various other embodiments will be described. In the various embodiments described below, parts which are the same as in the case of the first embodiment described above will be given the same reference symbols and detailed description thereof will be dispensed with: thus the description will focus on parts that are different.

Second Embodiment

Figure 31:
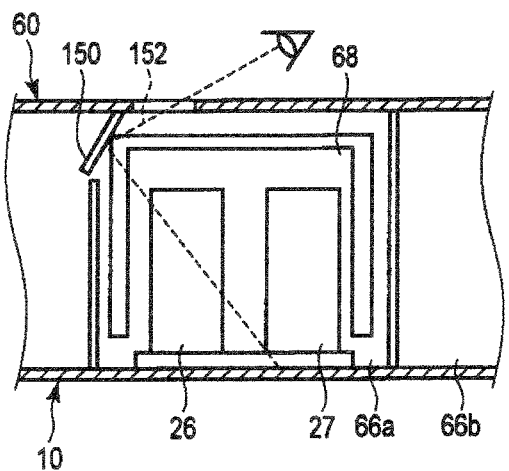
FIG. 31 is a cross-sectional view showing schematically drive control equipment according to a second embodiment.

FIG. 31 is a cross-sectional view showing diagrammatically drive control equipment according to a second embodiment. In this second embodiment, the frame 60 of the drive control equipment 10 is provided with a reflecting plate 150 that reflects an image of the connections of the PN input terminals of the power unit and the connection terminals of the filter capacitors to outside the frame. The surface of the reflecting plate 150 is formed for example as a mirror surface. The reflecting plate 150 is fixed for example to the inside face of the ceiling wall 62 of the frame 60. The mirror surface of the reflecting plate 150 is inclined with respect to the ceiling wall 62 and faces the aforementioned connections. Also, an observation window 152 that transmits the image that is reflected by the reflecting plate 150 is formed in the ceiling wall 62. In this way, the connection conditions of the aforementioned connections can be ascertained through the observation window 152 from outside the frame 60, so locations that are difficult to inspect from outside, being deep within, can easily be inspected.

Other aspects of the construction of the drive control equipment 10 of this second embodiment are the same as in the case of the first embodiment described above.

Third Embodiment

Figure 32:
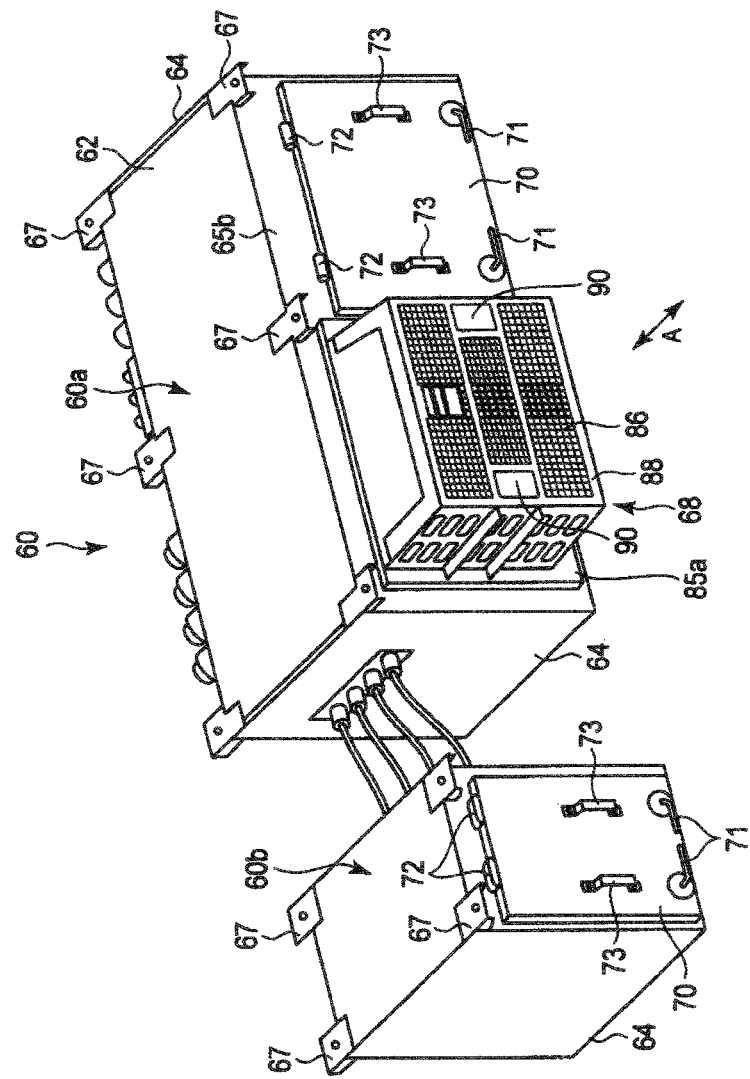
FIG. 32 is a perspective view showing drive control equipment according to a third embodiment.

FIG. 32 shows diagrammatically drive control equipment according to a third embodiment. In this embodiment, the frame 60 for the drive control equipment 10 is divided into a first frame 60a having a first accommodating section that accommodates the inverter and power unit and a second accommodating section that accommodates a control device; and a second frame 60b having a third accommodating section that accommodates the contactors. In this way, the contactors 16 of the drive control equipment 10 can be installed independently in another location, so the degree of freedom in relation to the location of installation of the drive control equipment 10 can be increased.

Fourth Embodiment

Figure 33:
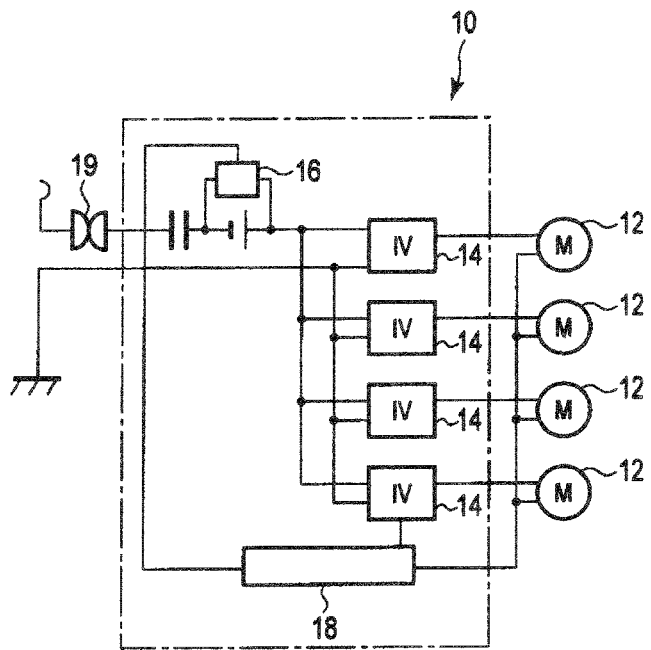
FIG. 33 is a block view showing schematically drive control equipment according to a fourth embodiment.

FIG. 33 is a block diagram of the layout of drive control equipment 10 according to a fourth embodiment. As shown in this Figure, in this fourth embodiment, the drive control equipment 10 comprises: four inverters respectively connected with four permanent magnet motors 12; a single contactor 16 connected in parallel between the power source 19 and the input side of these four inverters 14; and a control device 18 that controls the contactor 16 and the motors 12. Other aspects of the construction of the drive control equipment 10 are the same as in the case of the first embodiment described above.

In this way, the contactors 16 can be reduced to a single contactor and size reduction of the drive control equipment 10 can thereby be achieved, making it possible to reduce manufacturing costs.

Also with the second to fourth embodiments constructed as described above, drive control equipment can be provided in which increase in size can be suppressed and reduction in manufacturing costs can be achieved, in the same way as above.

While various embodiments of the present invention have been described, these embodiments are presented merely by way of example and are not intended to restrict the scope of the invention. Novel embodiments could be implemented in various ways and various deletions, substitutions or alterations could be performed without departing from the gist of the invention. Such embodiments or modifications are included in the scope of the invention and included in the invention and equivalents thereof set out in the patent claims. For example, the number of supporting legs and their shape are not restricted to the embodiments described above and could be altered in various ways as required.

FIELD OF INDUSTRIAL APPLICATION

The present invention may be utilized in rail vehicles in which drive control equipment for controlling drive of a motor is mounted.

What is claimed is:

1. A drive control equipment for a vehicle comprising:
a plurality of power conversion devices respectively connected to a plurality of motors provided in a vehicle, that convert a DC power that is supplied from a DC power source to AC power and output the AC power to the motors;
a control device that controls said power conversion devices;
a frame, having a ceiling wall facing a floor of the vehicle, a bottom wall facing a ground, and a sidewall connecting the ceiling wall and the bottom wall, that accommodates the power conversion devices and the control device; and
a power unit having a cooler in which are mounted a plurality of semiconductor elements constituting the power conversion devices, a first control board having a first connector connected with the semiconductor elements, arranged facing the cooler, and a second control board having a second connector connected with the first connector of the first control board, arranged a direction orthogonal to the first control board.

2. The drive control equipment according to claim 1, wherein the power unit has means capable of attachment/detachment with respect to the frame, which means is capable of performing attachment/detachment in a prescribed direction.

3. The drive control equipment according to claim 2, wherein the cooler comprises:
a cooling block having a heat-sink face where the plurality of semiconductor elements are mounted;
a plurality of radiating fins extending to outside the frame body from the cooling block; and
a shroud covering a sidewall side of the frame at the radiating fins.

4. The drive control equipment according to claim 3, wherein the radiating fins are set to earth potential.

5. The drive control equipment according to claim 1, wherein the power unit comprises:
a base frame that supports the power unit;
a pair of guide rails provided on the base frame and extending in a longitudinal direction of the second control board; and
a support board whose periphery engages the guide rail and that is connected through an insulating layer with the second control board.

6. The drive control equipment according to claim 1, wherein the power unit is provided, on a ceiling side of the power unit, with a plurality of output connectors that are mounted arranged in a row on a connector support frame and that are respectively connected with outputs of the plurality of power conversion devices.

7. The drive control equipment according to claim 6, wherein a plurality of locating pins are provided, mounted on the base frame and extending in an opposite direction to a cooling block.

8. The drive control equipment according to claim 7, wherein the power unit comprises PN input terminals having:
a plate-shaped positive electrode terminal connected with a power source of said power conversion device; and
a plate-shaped negative electrode terminal arranged superimposed on said positive electrode terminal, with an intervening insulating layer.

9. The drive control equipment according to claim 8, wherein the PN input terminals are provided on the bottom wall side of the frame in the power unit.

10. The drive control equipment according to claim 8, wherein the frame is provided with a capacitor arranged on the bottom wall of the frame and the capacitor has connecting terminals engaged with the PN input terminals.

11. The drive control equipment according to claim 10, wherein the capacitor is connected with a power source connector provided in the frame and the frame has a reflecting plate that reflects connections of the power source connector and the capacitor to outside the frame.

12. The drive control equipment according to claim 1, wherein said frame comprises
a main frame constituted by the ceiling wall, the bottom wall and the side wall; and
an equipment cover that is mounted on the main frame by means of a hinge;
wherein the hinge comprises
a pivot shaft having a rod-shaped shaft mounted on either the main frame or the equipment cover, and
a tubular acceptor mounted on the other of the main frame or equipment cover on which the pivot shaft is mounted;
and wherein,
in the main frame, there is provided a stopper, provided on the equipment cover, that restricts movement of the pivot shaft or the acceptor in a withdrawal direction.

13. The drive control equipment according to claim 1, wherein a plurality of link connectors that are provided exposed to an outside on the frame, and the power conversion device or the contactor that are arranged within the frame are connected through wiring.

14. The drive control equipment according to claim 1, wherein the frame comprises
a main accommodating section that accommodates the power conversion device and control device and an auxiliary accommodating section that accommodates the plurality of contactors; and
an auxiliary accommodating section is linked with the main accommodating section in a manner such that the auxiliary accommodating section can be separated from the main accommodating section.

* * * * *